(12) United States Patent
Nishiwaki

(10) Patent No.: US 8,529,114 B2
(45) Date of Patent: Sep. 10, 2013

(54) SHEET AND LIGHT EMITTING DEVICE

(75) Inventor: Seiji Nishiwaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 586 days.

(21) Appl. No.: 12/522,355

(22) PCT Filed: Nov. 12, 2008

(86) PCT No.: PCT/JP2008/003299
§ 371 (c)(1),
(2), (4) Date: Jul. 7, 2009

(87) PCT Pub. No.: WO2009/063636
PCT Pub. Date: May 22, 2009

(65) Prior Publication Data
US 2010/0046236 A1    Feb. 25, 2010

(30) Foreign Application Priority Data
Nov. 13, 2007   (JP) .................. 2007-294849

(51) Int. Cl.
*F21V 7/04* (2006.01)

(52) U.S. Cl.
USPC .......................... 362/615; 362/606

(58) Field of Classification Search
USPC .......................... 362/606, 615–620
See application file for complete search history.

(56) References Cited

U.S. PATENT DOCUMENTS

| | | | |
|---|---|---|---|
| 5,227,915 A * | 7/1993 | Grossinger et al. | 359/565 |
| 5,742,433 A * | 4/1998 | Shiono et al. | 359/575 |
| 6,476,550 B1 | 11/2002 | Oda et al. | |
| 2002/0180348 A1 | 12/2002 | Oda et al. | |
| 2003/0090888 A1 * | 5/2003 | Mizutani et al. | 362/31 |
| 2004/0056592 A1 | 3/2004 | Noguchi | |
| 2006/0119751 A1 * | 6/2006 | Suehiro et al. | 349/5 |
| 2006/0221634 A1 * | 10/2006 | Sato et al. | 362/611 |
| 2007/0153543 A1 * | 7/2007 | Xu et al. | 362/600 |
| 2008/0013300 A1 * | 1/2008 | Yurochko | 362/29 |

FOREIGN PATENT DOCUMENTS

| | | |
|---|---|---|
| JP | 60-53841 | 11/1985 |
| JP | 63-314503 | 12/1988 |
| JP | 11-283751 | 10/1999 |

(Continued)

OTHER PUBLICATIONS

International Preliminary Report on Patentability for corresponding International Application No. PCT/JP2008/003299 mailed Jun. 29, 2010 and English translation.

*Primary Examiner* — Julie Shallenberger
(74) *Attorney, Agent, or Firm* — Renner, Otto, Boisselle & Sklar, LLP

(57) ABSTRACT

A sheet and a light emitting device are provided which also emit light having an incident angle larger than or equal to a critical angle to significantly increase light extraction efficiency, prevent ambient light reflection, and suppress the occurrence of a distribution of light intensity varying depending on the direction and an imbalance in color. The light emitting device has a surface structure (13) in a surface adjacent to a light emitting element of a transparent substrate (5). The surface of the transparent substrate (5) is virtually divided into minute regions without a gap, the diameter of a largest circle inscribed in the minute region being 0.2 µm or more and 1.5 µm or less. Each minute region has a convex or concave shape in the surface of the transparent substrate 5. The proportions of the convex shapes and the concave shapes are P and 1−P, respectively, where P is within the range of 0.4 to 0.98.

38 Claims, 25 Drawing Sheets

(56) References Cited

FOREIGN PATENT DOCUMENTS

| JP | 2003-262505 | 9/2003 |
| JP | 2004-119286 | 4/2004 |
| JP | 2005-266188 | 9/2005 |
| JP | 2005-276581 | 10/2005 |

* cited by examiner (a)

(b)

(a)

(b)

(a)

(b)

(a)

(b)

(a)

(b)

(a)

(b)

(a)

(b)

(a)

(b)

(a)

(b)

SHEET AND LIGHT EMITTING DEVICE

RELATED APPLICATIONS

This application is the U.S. National Phase under 35 U.S.C. §371 of International Application No. PCT/JP2008/003299, filed on Nov. 12, 2008, which in turn claims the benefit of Japanese Application No. 2007-294849, filed on Nov. 13, 2007, the disclosures of which Applications are incorporated by reference herein.

TECHNICAL FIELD

The present invention relates to a transparent sheet one surface of which is adjacent to a light emitting element in use, and a light emitting device employing the sheet.

BACKGROUND ART

There are conventional techniques disclosed in Patent Documents 1 and 2, for example.

FIG. 14 shows a cross-sectional structure of a general light emitting device employing an organic electroluminescence element (organic EL element), and how light propagates therethrough. An electrode 102, a light emitting layer 103, and a transparent electrode 104 are laminated in this stated order on a substrate 101, and a transparent substrate 105 is provided on the transparent electrode 104. When a voltage is applied between the electrode 102 and the transparent electrode 104, light is produced at a point S in the light emitting layer 103. The light is transmitted through the transparent electrode 104 directly or after being reflected by the electrode 102, enters a point P on a surface of the transparent substrate 105 at an angle θ from the surface normal to the surface, and is diffracted at this point and emitted into an air layer 106.

Let $n'_1$ be the refractive index of the transparent substrate 105. When the incident angle θ exceeds a critical angle $\theta_c = \sin^{-1}(1/n'_1)$, total reflection occurs. For example, light which enters a point Q on the surface of the transparent substrate 105 at an angle larger than or equal to $\theta_c$ is totally reflected and therefore is not emitted into the air layer 106.

FIGS. 16(a) and 16(b) are diagrams for describing the light extraction efficiency of the light emitting device, assuming that the transparent substrate 105 has a multilayer structure. In FIG. 16(a), let $n'_k$ be the refractive index of the light emitting layer 103, let no be the refractive index of the air layer 106, and let $n'_{k-1}$, $n'_{k-2}$, ..., and $n'_1$ be the refractive indices of a plurality of transparent layers provided between the light emitting layer 103 and the air layer 106 in order of distance from the light emitting layer 103, closest first. Let $\theta'_k$ be the propagation direction (angle from the surface normal of a surface of refraction) of light emitted from the point S in the light emitting layer 103, and let $\theta'_{k-1}, \theta'_{k-2}, \ldots, \theta'_1$, and $\theta_0$ be the angles of refraction of the surfaces of refraction in order of distance from the light emitting layer 103, closest first. In this case, according to Snell's law, the following expression is satisfied:

$$n'_k \times \sin \theta'_k = n'_{k-1} \times \sin \theta'_{k-1} = \ldots = n'_1 \times \sin \theta'_1 = n_0 \times \sin \theta_0 \quad \text{(Expression 1)}$$

Therefore, the following expression is satisfied:

$$\sin \theta'_k = \sin \theta_0 \times n_0/n'_k \quad \text{(Expression 2)}$$

Eventually, Expression 2 represents Snell's law when the light emitting layer 103 directly contacts the air layer 106, regardless of the refractive indices of the transparent layers interposed therebetween, i.e., indicates that total reflection occurs when $\theta'_k \geq \theta_c = \sin^{-1}(n_0/n'_k)$.

FIG. 16(b) schematically shows the range of light which can be extracted from the light emitting layer 103. The light which can be extracted is included within a pair of cones 107 and 107' around the z axis as a center axis along with the surface normal of a surface of refraction, where their vertices are the light production point S, and their vertex angles are twice as large as the critical angle $\theta_c$. If it is assumed that light beams emitted in all directions from the point S have the same intensity and that the transmittances at the surface of refraction are 100% at incident angles within the critical angle, an efficiency η at which light is extracted from the light emitting layer 103 is equal to the ratio of an area obtained as the intersections of a sphere 108 with the cones 107 and 107' to the surface area of the sphere 108. The extraction efficiency η is given by:

$$\eta = 1 - \cos \theta_c \quad \text{(Expression 3)}$$

Note that the actual extraction efficiency η is smaller than $1 - \cos \theta_c$ since the transmittance within the critical angle is not equal to 100%. The total efficiency of the light emitting element is the product of the light emission efficiency of the light emitting layer and the extraction efficiency η.

Regarding the aforementioned mechanism, Patent Document 1 discloses an organic EL element in which the light extraction efficiency is improved by forming a diffraction grating on a substrate interface, an internal surface or a surface of reflection to change the incident angle of light to a light extraction surface, so as to suppress total reflection on a surface of a transparent substrate when light is emitted from the transparent substrate to the air.

Patent Document 2 discloses an organic EL element in which a plurality of transparent projections are formed on a surface of a transparent substrate so that light is prevented from being reflected on an interface between the transparent substrate and air, so as to provide a planar light emitting device having a satisfactory light extraction efficiency.

Patent Document 1: Japanese Unexamined Patent Application Publication No. H11-283751

Patent Document 2: Japanese Unexamined Patent Application Publication No. 2005-276581

DISCLOSURE OF THE INVENTION

Problems to be Solved by the Invention

However, conventional light emitting devices as described above have the following problems.

In the conventional light emitting device employing the organic EL element of FIG. 14, the efficiency η of extracting light from the light emitting layer 103 at its maximum does not exceed $1 - \cos \theta_c$. In addition, if the refractive index of the light emitting layer 103 is determined, the maximum value of the light extraction efficiency is uniquely limited. For example, if it is assumed that $n_0 = 1.0$ and $n'_k = 1.457$ in Expression 2, the critical angle $\theta_c = \sin^{-1}(n_0/n'_k) = 43.34$ degrees and the maximum value of the light extraction efficiency is as small as about $1 - \cos \theta_c = 0.273$. If $n'_k = 1.70$, the maximum value of the light extraction efficiency is even smaller, i.e., about 0.191.

In the technique disclosed in Patent Document 1, it is true that light which would otherwise be totally reflected can be extracted. However, in some cases, light which would otherwise not be totally reflected may not be extracted. Specifically, if it is assumed that no diffraction grating layer is provided, light emitted from a point in the light emitting layer which enters the surface of refraction (emission surface) of the transparent substrate at an angle smaller than the critical angle may be transmitted through and refracted at the surface of refraction. However, when a diffraction grating layer is provided to cause diffraction, the incident angle of the light to the surface of refraction may exceed the critical angle, resulting in total reflection. Therefore, the technique disclosed in Patent Document 1 does not ensure an improvement in the light extraction efficiency. Moreover, in the technique disclosed in Patent Document 1, diffracted light is generated which includes light beams the directions of all of which are uniformly shifted by a predetermined amount. Light including such diffracted light has a distribution of light intensity varying depending on the direction. The predetermined amount (shift width) depends on the wavelength of emitted light. Therefore, there is an imbalance in color between directions.

Also, in the light emitting device disclosed in Patent Document 1, light entering from the outside (on the air layer side) is regularly reflected on the surface of the transparent substrate, which disturbs light extracted from the light emitting layer (so-called ambient light reflection). Therefore, the surface of the transparent substrate needs to be subjected to an optical treatment, such as an anti-reflection film or the like, resulting in an increase in product cost.

On the other hand, the light emitting device disclosed in Patent Document 2 is directed to prevention of reflection of light on the surface of refraction. This structure only improves the light extraction efficiency by as small as about 10 to 20%.

In view of the aforementioned problems, the present invention has been achieved. An object of the present invention is to provide a sheet and a light emitting device which also emit light entering a transparent substrate at a critical angle or more to significantly increase light extraction efficiency, prevent ambient light reflection, and suppress the occurrence of a distribution of light intensity varying depending on the direction and an imbalance in color.

Solution to the Problems

To achieve the object, a first sheet of the present invention is a transparent sheet having a first surface and a second surface. The first surface is adjacent to a light emitting element in use. The second surface is virtually divided into a plurality of minute regions $\delta$, a diameter of a largest circle inscribed in the minute region $\delta$ being 0.2 μm or more and 1.5 μm or less, and one minute region $\delta$ being adjacent to and surrounded by a plurality of other minute regions $\delta$. The plurality of minute regions $\delta$ include a plurality of minute regions $\delta_1$ and a plurality of minute regions $\delta_2$, the plurality of minute regions $\delta_1$ being randomly selected from the plurality of minute regions $\delta$ and accounting for 40% or more and 98% or less of the plurality of minute regions $\delta$, and the plurality of minute regions $\delta_2$ being the other minute regions $\delta$. The minute region $\delta_1$ projects toward a position above the second surface with respect to a predetermined reference plane parallel with the second surface, the minute region $\delta_1$ having a height d/2. The minute region $\delta_2$ dents toward a position below the second surface with respect to the predetermined reference plane, the minute region $\delta_2$ having a depth d/2. The predetermined reference plane is located at a middle position between the minute region $\delta_1$ and the minute region $\delta_2$ in a direction perpendicular to the second surface. The value d is 0.2 μm or more and 1.4 μm or less.

With such a structure, even if light which is transmitted from a light emitting element through the inside of the sheet, enters the second surface of the sheet at an angle larger than or equal to the critical angle with respect to the surface normal of the second surface, the surface structure including the minute regions provided in the second surface prevents the light from being totally reflected, thereby emitting a portion of the light to the outside. Moreover, light which is reflected on the second surface to enter the light emitting element, is reflected in the light emitting element to enter the second surface of the sheet again. Also in this case, the light is not totally reflected and a portion of the light is emitted to the outside.

A second sheet of the present invention is a transparent sheet having a first surface and a second surface. The first surface is adjacent to a light emitting element in use. The second surface is virtually divided into a plurality of minute regions $\delta$, a diameter of a largest circle inscribed in the minute region $\delta$ being 0.2 μm or more and 1.5 μm or less, and one minute region $\delta$ being adjacent to and surrounded by a plurality of other minute regions $\delta$. Each of the plurality of minute regions $\delta$ is located at a random height within a range of 0 or more and d/2 or less above a predetermined reference plane parallel with the second surface, or at a random depth within a range of 0 or more and d/2 or less below the predetermined reference plane. The predetermined reference plane is located at a middle position between a minute region $\delta$ at a highest position and a minute region $\delta$ at a lowest position in a direction perpendicular to the second surface. The value d is 0.2 μm or more and 1.4 μm or less.

A third sheet of the present invention is a transparent sheet having a first surface and a second surface. The first surface is adjacent to a light emitting element in use. The second surface is virtually divided into a plurality of minute regions $\delta$, a diameter of a largest circle inscribed in the minute region $\delta$ being 0.4 μm or more and 1.0 μm or less, and one minute region $\delta$ being adjacent to and surrounded by a plurality of other minute regions $\delta$. The plurality of minute regions $\delta$ include a plurality of minute regions $\delta_1$ and a plurality of minute regions $\delta_2$. The minute region $\delta_1$ and the minute region $\delta_2$ cause light transmitted through the minute region $\delta_1$ and light transmitted through the minute region $\delta_2$ after entering the first surface in a direction perpendicular to the one surface, to generate a phase difference of 180 degrees.

The minute regions $\delta$ can have congruent polygonal shapes.

A first light emitting device of the present invention is a light emitting device comprising a light emitting element, and a transparent protective layer provided on a light emission surface of the light emitting element. A second surface opposite to a first surface adjacent to the light emission surface of the protective layer is virtually divided into a plurality of minute regions $\delta$, a diameter of a largest circle inscribed in the minute region $\delta$ being 0.2 μm or more and 1.5 μm or less, and one minute region $\delta$ being adjacent to and surrounded by a plurality of other minute regions $\delta$. The plurality of minute regions $\delta$ include a plurality of minute regions $\delta_1$ and a plurality of minute regions $\delta_2$, the plurality of minute regions $\delta_1$ being randomly selected from the plurality of minute regions $\delta$ and accounting for 40% or more and 98% or less of the plurality of minute regions $\delta$, and the plurality of minute regions $\delta_2$ being the other minute regions $\delta$. The minute region $\delta_1$ projects toward a position above the second surface with respect to a predetermined reference plane parallel with the second surface, the minute region $\delta_1$ having a height d/2. The minute region $\delta_2$ dents toward a position below the second surface with respect to the predetermined reference plane, the minute region $\delta_2$ having a depth d/2. The predetermined reference plane is located at a middle position between the minute region $\delta_1$ and the minute region $\delta_2$ in a direction perpendicular to the second surface. The light emitting element emits light having a center wavelength $\lambda$ of an emission spectrum. An expression $\lambda/6(n_1-n_0)<d<\lambda/(n_1-n_0)$ is satisfied, where $n_1$ represents a refractive index of the protective layer, $n_0$ represents a refractive index of a medium contacting the second surface of the protective layer, and $n_0<n_1$.

A second light emitting device of the present invention is a light emitting device comprising a light emitting element, and a transparent protective layer provided on a light emission surface of the light emitting element. A second surface opposite to a first surface adjacent to the light emission surface of the protective layer is virtually divided into a plurality of minute regions δ, a diameter of a largest circle inscribed in the minute region δ being 0.2 μm or more and 1.5 μm or less, and one minute region δ being adjacent to and surrounded by a plurality of other minute regions δ. Each of the plurality of minute regions δ is located at a random height within a range of 0 or more and d/2 or less above a predetermined reference plane parallel with the second surface, or at a random depth within a range of 0 or more and d/2 or less below the predetermined reference plane. The predetermined reference plane is located at a middle position between a minute region δ at a highest position and a minute region δ at a lowest position in a direction perpendicular to the second surface. The light emitting element emits light having a center wavelength λ of an emission spectrum. An expression $\lambda/6(n_1-n_0)<d<\lambda/(n_1-n_0)$ is satisfied, where $n_1$ represents a refractive index of the protective layer, $n_0$ represents a refractive index of a medium contacting the second surface of the protective layer, and $n_0<n_1$.

A third light emitting device of the present invention is a light emitting device comprising a light emitting element, and a transparent protective layer provided on a light emission surface of the light emitting element. A second surface opposite to a first surface adjacent to the light emission surface of the protective layer is virtually divided into a plurality of minute regions δ, a diameter of a largest circle inscribed in the minute region δ being 0.4 μm or more and 1.0 μm or less, and one minute region δ being adjacent to and surrounded by a plurality of other minute regions δ. The plurality of minute regions δ include a plurality of minute regions $δ_1$ and a plurality of minute regions $δ_2$. The minute region $δ_1$ and the minute region $δ_2$ cause light transmitted through the minute region $δ_1$ and light transmitted through the minute region $δ_2$ after entering the first surface adjacent to the light emission surface of the protective layer in a direction perpendicular thereto, to generate a phase difference of 180 degrees.

The medium can be air.

The medium can be an aerogel.

An expression $n_2-n_1<0.1$ can be satisfied, where $n_2$ represents a refractive index of a portion of the light emitting element in which light is produced.

Effect of the Invention

Thus, light having an incident angle exceeding a critical angle can be repeatedly extracted, thereby making it possible to significantly improve light extraction efficiency. Moreover, diffraction caused by the random structure can eliminate the regularity of diffraction directions, thereby suppressing the occurrence of ambient light reflection, a distribution of light intensity varying depending on the direction, and an imbalance in color.

BRIEF DESCRIPTION OF THE DRAWINGS

FIG. 3(a) is a diagram for describing the incident angle dependency of the transmittance during first light extraction.

FIG. 3(b) is a diagram for describing the incident angle dependency of the transmittance during second light extraction.

FIG. 4(a) is a diagram for describing the incident angle dependency of the extracted light amount during first light extraction. FIG. 4(b) is a diagram for describing the incident angle dependency of the extracted light amount during second light extraction.

DESCRIPTION OF THE REFERENCE CHARACTERS

| | |
|---|---|
| 1 | substrate |
| 2 | electrode |
| 3 | light emitting layer |
| 4 | transparent electrode |
| 5 | transparent substrate |
| 6 | air |
| 13 | surface structure |
| S | light emission point |

BEST MODE FOR CARRYING OUT THE INVENTION

Before describing embodiments of the present invention, it will be described how the present invention has been achieved while referring to prior art examples, such as Patent Document 1, Patent Document 2 and the like.

Figure 15:
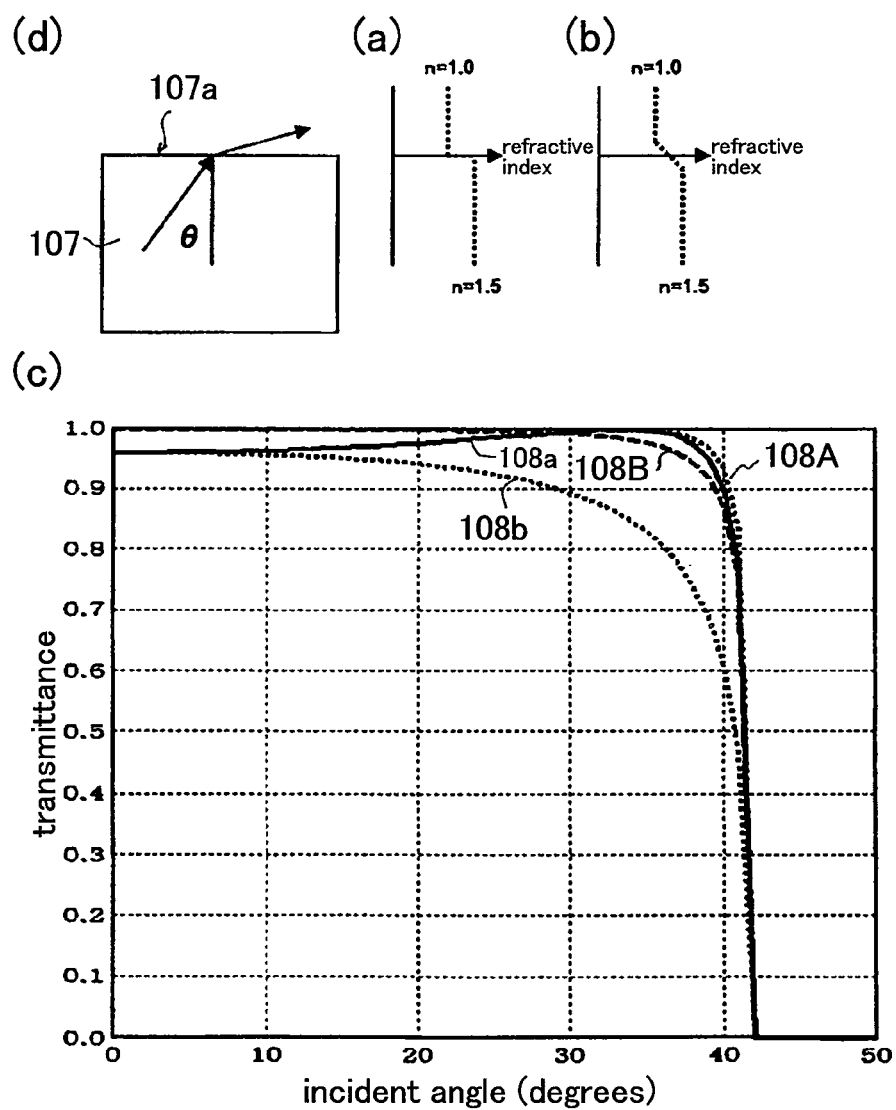
FIG. 15(a) is a diagram showing a stepwise change in refractive index.
FIG. 15(b) is a diagram showing a gradual change in refractive index.
FIG. 15(c) is a diagram showing a relationship between incident angles and transmittances in a surface of refraction.
FIG. 15(d) is a diagram showing a surface of refraction.
Figure 16:
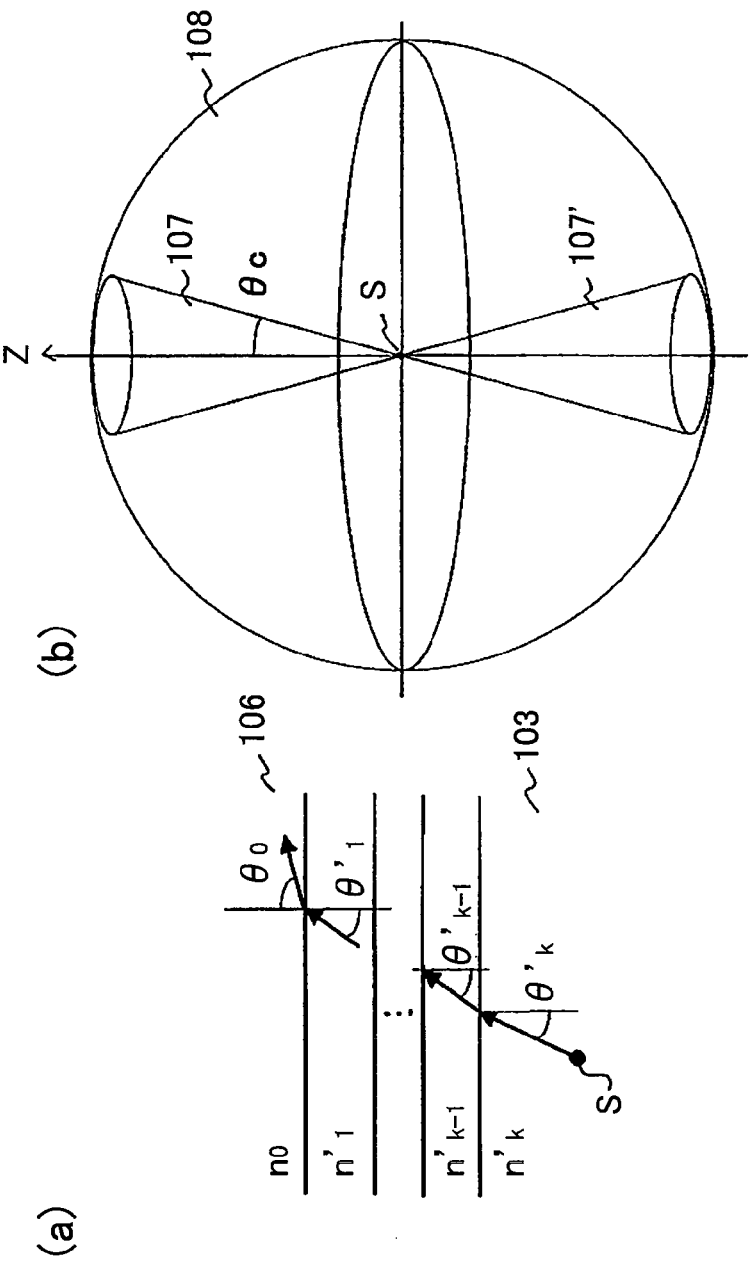
FIG. 16(a) is a diagram for describing a transparent substrate of a multilayer structure.
FIG. 16(b) is a diagram for describing a range within which light can be extracted.

FIG. 15 is a diagram for describing a transmittance at a surface of refraction (an interface between a surface of a transparent layer and an air layer). The transmittance of light which enters a surface of refraction 107a of a transparent layer 107 having a refractive index of 1.5 at an angle θ in a drawing sheet direction from the inside of the transparent layer 107, and is refracted by the air (refractive index: 1.0), depends on the polarized state of the light. Refractive indices are typically distributed in a stepwise manner as shown in FIG. 15(a) along a surface normal in the vicinity of the surface of refraction 107a. Therefore, p-polarized light (an oscillation component having an electric field vector parallel with the drawing sheet) has transmittance characteristics indicated by curve 108a, and s-polarized light (an oscillation component having an electric field vector perpendicular to the drawing sheet) has transmittance characteristics indicated by curve 108b. Both p- and s-polarized light beams become zero when their incident angles exceed a critical angle (=41.8 degrees), although they have different behaviors when their incident angles are smaller than or equal to the critical angle.

On the other hand, if it is assumed that a surface portion of the transparent layer 107 is caused to have a multilayer structure which provides a refractive index distribution having a taper shape as shown in FIG. 15(b), p-polarized light has transmittance characteristics indicated by curve 108A, and s-polarized light has transmittance characteristics indicated by curve 108B. Both p- and s-polarized light beams similarly become zero when their incident angles exceed a critical angle, although their transmittances are closer to 100% when their incident angles are smaller than or equal to the critical angle. The transmittances approach the shape of a step function where the critical angle is a boundary. FIG. 15(b) assumes a multilayer structure including fifty films each having a thickness of 0.01 μm, where the refractive indices of the films range from 1.5 to 1.0 with a difference between each film is 0.01 μm. The more gradual the slope of a change in refractive index in the thickness direction, the smaller the difference between p-polarized light and s-polarized light, i.e., the closer the graph of the transmittance versus the incident angle for each of p- and s-polarized light is to a step function.

Figure 17:
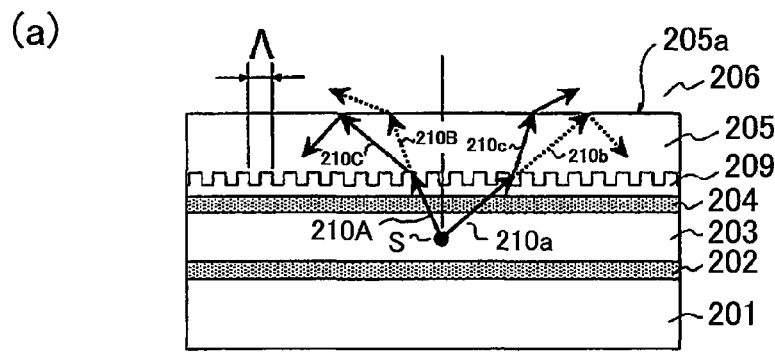
FIG. 17(a) is a cross-sectional view of a light emitting device including a diffraction grating having a periodic structure as an interface.
FIG. 17(b) is a top view of FIG. 17(a).
Figure 17:
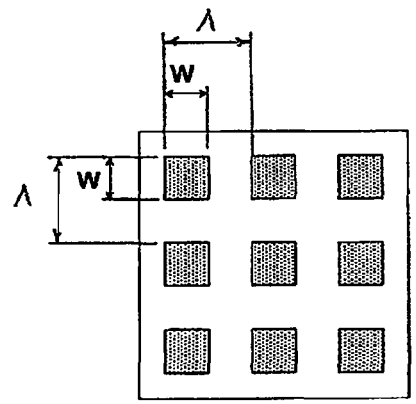

In order to avoid total reflection, it is necessary to devise a technique of causing the incident angle of light entering the surface of refraction to be smaller than or equal to the critical angle. As an example of such a technique, referring to Patent Document 1, a light emitting device employing an organic EL element in which a diffraction grating 209 is provided at an interface between a transparent substrate 205 and a transparent electrode 204 as shown in FIG. 17 was studied.

As shown in FIG. 17(a), an electrode 202, a light emitting layer 203, the transparent electrode 204, and a diffraction grating layer 209 are laminated in this stated order on a substrate 201. The transparent substrate 205 is provided on the diffraction grating layer 209. The diffraction grating layer 209 has a periodic concave-and-convex structure between it and the transparent substrate 205. The structure has a pitch A in both an x-direction and a y-direction. The convex portions are each in the shape of a square having a width was shown in FIG. 17(b). The convex portions are arranged in a matrix, i.e., are regularly spaced in both the x-direction and the y-direction. When a voltage is applied between the electrode 202 and the transparent electrode 204, light is produced at a point S in the light emitting layer 203. The light is transmitted through the transparent electrode 204 directly or after being reflected by the electrode 202, is transmitted through and is diffracted by the diffraction grating layer 209. For example, if it is assumed that light 210a emitted from the point S travels in a straight line without being diffracted by the diffraction grating layer 209, the light 210a (indicated as light 210b) enters the surface of refraction 205a of the transparent substrate 205 at an angle larger than or equal to the critical angle and is therefore totally reflected. Actually, the light 210a is diffracted by the diffraction grating layer 209, and therefore, the incident angle of the light 210a (indicated as light 210c) to the surface of refraction 205a becomes smaller than the critical angle, so that the light 210c can be transmitted through the surface of refraction 205a.

Figure 18:
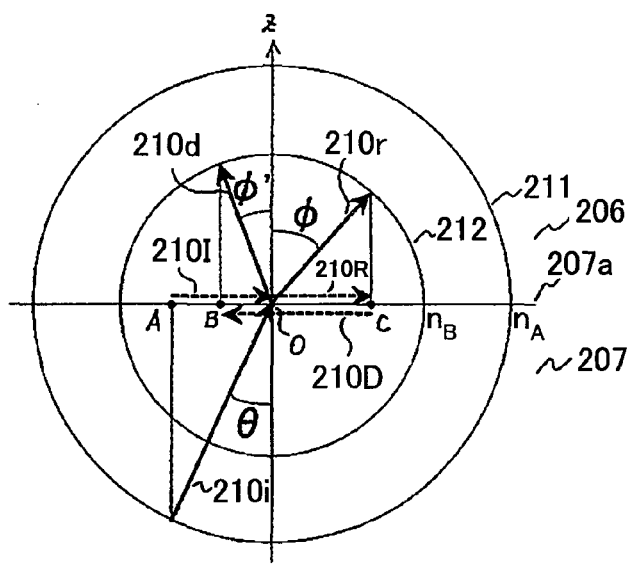
FIG. 18 is a diagram for describing diffraction directions of a diffraction grating.

Diffraction directions of the diffraction grating will be described with reference to FIG. 18. It is here assumed that light having a wavelength λ enters a surface of refraction 207a of a transparent layer 207 having a refractive index $n_A$ at a point O thereof at an angle θ in a drawing sheet direction from the inside of the transparent layer 207, and is diffracted by a transparent layer 206 having a refractive index $n_B$. A diffraction grating having a pitch A is formed on the surface of refraction 207a along the drawing sheet. A circle 211 having a radius $n_A$ and a circle 212 having a radius $n_B$, whose centers are the point O, are drawn on the drawing sheet. An incident vector (a vector having an initial point on the perimeter of the circle 211 and a direction toward the point O at an angle θ) is indicated by 210i, and a vector (a vector from a foot A of a perpendicular toward the point O) which is an orthogonal projection of the incident vector onto the surface of refraction 207a is indicated by 210I. A vector 210r having an initial point at the point O and a terminal point on the perimeter of the circle 212 is drawn in a manner which allows its orthogonal projection vector 210R to be equal to the vector 210I. Consider a vector (lattice vector) having an initial point at a foot C of a perpendicular and a magnitude qλ/Λ, where q is an order of diffraction (integer). In FIG. 18, assuming that q=1, a vector 210D is drawn, and a vector 210d having a foot of a perpendicular at the terminal point B of the vector 210D, an initial point at the point O and a terminal point on the perimeter of the circle 212 is drawn. According to the way in which this diagram is drawn, a direction angle ϕ of the vector 210r (an angle from the normal to the surface of refraction) is given by:

$$n_B \times \sin \phi = n_A \times \sin \theta \quad \text{(Expression 4)}$$

This exactly represents Snell's law. On the other hand, a direction angle ϕ' of the vector 210d (an angle from the normal to the surface of refraction) indicating a direction of a diffracted light beam is given by:

$$n_B \times \sin \phi' = n_A \times \sin \theta - q\lambda/\Lambda \quad \text{(Expression 5)}$$

Note that, in the case of FIG. 18, the angle ϕ' straddles a z-axis (the normal to the surface of refraction passing through the point O) and is therefore defined as being negative.

Thus, the direction of the diffracted light beam is deviated by qλ/Λ from the refracted light beam. In FIG. 17, the light beam 210b which is assumed not to be diffracted corresponds to the refracted light beam. The diffracted light beam 210c is deviated by qλ/Λ from the light beam 210b. As a result, the diffracted light beam 210c is not totally reflected on the surface of refraction 205a. Therefore, light which would otherwise be totally reflected can be extracted. It may seem to be expected that the light extraction efficiency can be improved as compared to an organic EL light emitting device which does not have a diffraction grating layer.

However, in FIG. 17(a), if it is assumed that the light 210A emitted at the point S travels in a straight line without being diffracted by the diffraction grating layer 209, the light 210A (indicated as the light 210B) enters the surface of refraction 205a of the transparent substrate 205 at an angle smaller than or equal to the critical angle, and is refracted by and is transmitted through the surface of refraction 205a. Actually, the light 210A is diffracted by the diffraction grating layer 209, the incident angle of the light 210A (indicated as the light 210C) to the surface of refraction 205a becomes larger than the critical angle, i.e., the light 210A enters the surface of refraction 205a at an angle larger than or equal to the critical angle and therefore undergoes total reflection. Thus, even if the diffraction grating layer 209 is provided, an improvement in the light extraction efficiency is not certainly ensured.

Also, in the light emitting device employing the organic EL element of FIG. 17, diffracted light is generated which includes light beams the directions of all of which are uniformly shifted by qλ/Λ. Light including such diffracted light has a distribution of light intensity varying depending on the direction. The shift width qλ/Λ depends on the wavelength λ of emitted light. Therefore, there is an imbalance in color between directions. In other words, the color of light varies depending on the viewing direction, which is obviously not convenient to display applications, or also to light sources.

Figure 19:
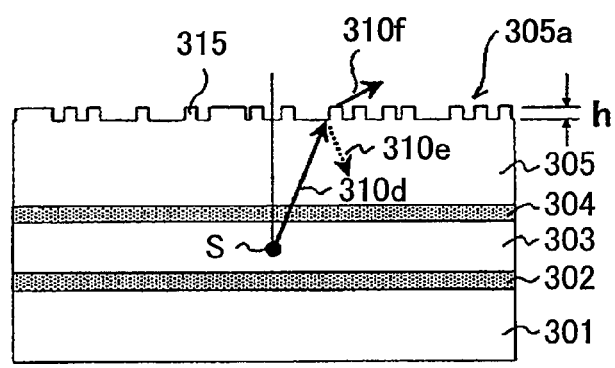
FIG. 19(a) is a cross-sectional view of a light emitting device including projections randomly arranged in a surface.
FIG. 19(b) is a top view of FIG. 19(a).
Figure 19:
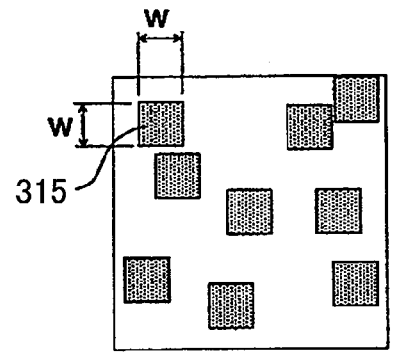

Next, referring to Patent Document 2 as an example, a light emitting device employing an organic EL element in which projections 315 are provided in a surface of a transparent substrate 305 as shown in FIG. 19 was studied. As shown in FIG. 19(a), an electrode 302, a light emitting layer 303, a transparent electrode 304, and a transparent substrate 305 are laminated in this stated order on a substrate 301. A plurality of projections 315 are formed in a surface 305a of the transparent substrate 305. The projections 315, each of which is in the shape of a rectangular prism having a width w and a height h, are arranged at random positions in the transparent substrate surface 305a as shown in FIG. 19(b). The magnitude of w is within the range of 0.4 to 20 μm and the magnitude of h is within the range of 0.4 to 10 μm. The projections 315 are formed at a density within the range of 5000 to 1000000/ mm². When a voltage is applied between the electrode 302 and the transparent electrode 304, light is produced at a point S in the light emitting layer 303. The light 310d is transmitted through the transparent electrode 304 directly or after being reflected by the electrode 302, and a portion thereof (indicated by 310f) is extracted through the projection 315 to the outside. Actual projections 315 can be shaped by side etching in a manner which allows each projection to become narrower toward a tip thereof. Even if side etching is not performed, the effective refractive index takes a value in the vicinity of a middle between those of the transparent substrate 305 and air, and therefore, the refractive index distribution can be equivalently gradually changed. Therefore, a refractive index distribution close to that of the FIG. 15(b) is obtained, so that light reflection as indicated by 310e can be partially prevented by the projection 315. As a result, the light extraction efficiency can be improved. In addition, even if a size of the projection 315 is set to be larger than or equal to a wavelength, the interference of extracted light can be suppressed since the projections 315 are randomly arranged.

However, if the effect of the projection in the light emitting device having the structure of FIG. 19 is assumed to be prevention of reflection proposed in Patent Document 2, the improvement of the transmittance is attributed only to light having an angle smaller than or equal to the critical angle, which can be seen from comparison of curves 108a and 108b and curves 108A and 108B of FIG. 15(c). Therefore, the improvement of the light extraction efficiency is not more than about 10 to 20%, i.e., a significant improvement cannot be expected.

The present inventors have done studies as described above. Based on the studies, the present inventors have done further studies on how to reduce the amount of light totally reflected on a surface of refraction so as to increase the amount of extracted light. As a first of these further studies, boundary conditions for light at a surface of refraction were examined.

Figure 13:
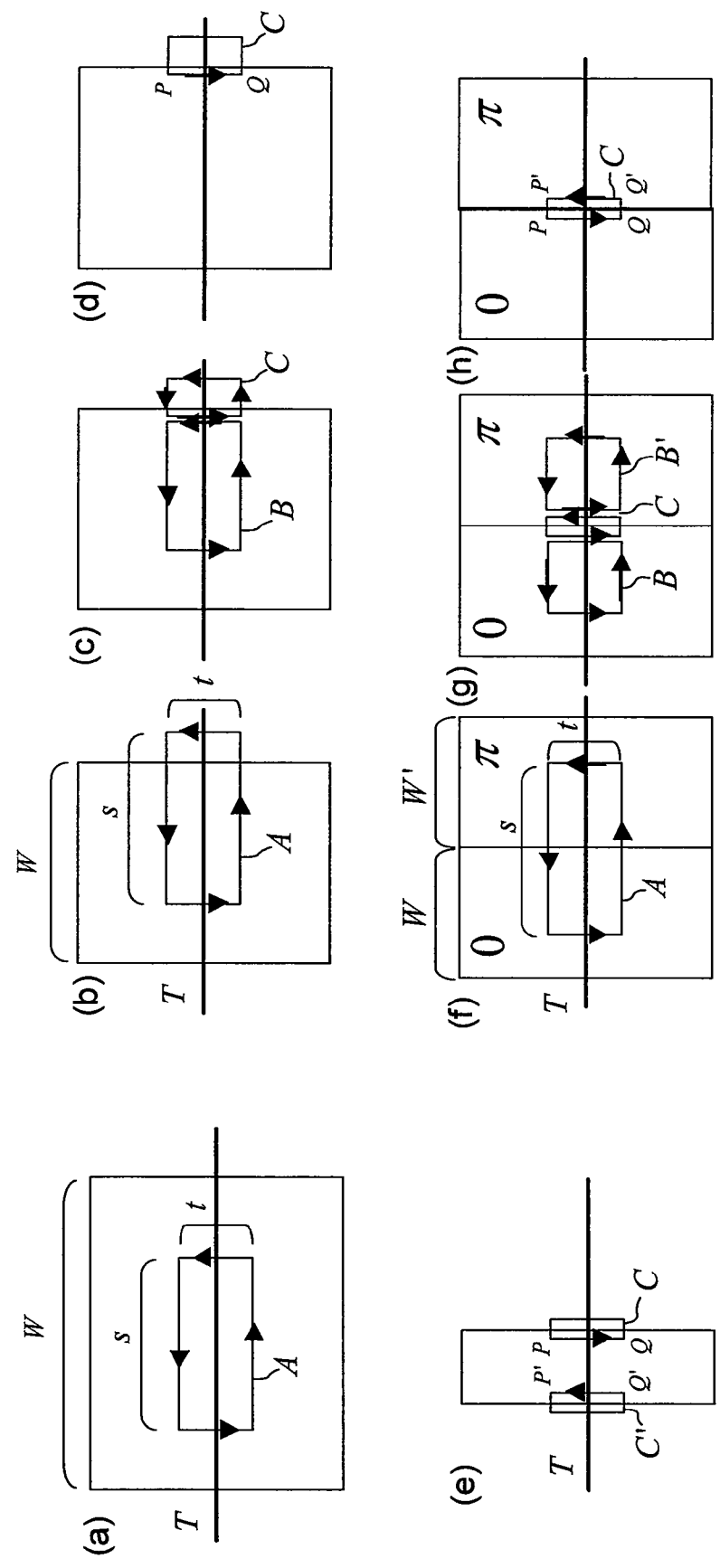
FIGS. 13(a) to 13(h) are diagrams for describing boundary conditions for the field of light in a surface of refraction.

FIG. 13 schematically shows boundary conditions for field of light at a surface of refraction, assuming that light having a width W enters a surface of refraction T. According to Maxwell's equations, an integral of an electric field vector or a magnetic field vector along a path A (closed curve) across the surface of refraction T is zero. Note that it is satisfied under conditions that no charge or light source exist within the closed loop, and the intensity and phase of the electric or magnetic field vector is continuous along the surface of refraction T.

When the width W is sufficiently large as shown in FIG. 13(a), a width t perpendicular to the surface of refraction can be reduced to a negligibly small value as compared to a width s along the surface of refraction. Therefore, of the closed line integral, only components along the surface of refraction are left. According to this relationship, the electric or magnetic field vector needs to be continuous across the surface of refraction. This continuity is utilized to derive the Fresnel equations. The Fresnel equations clearly explain the laws of reflection and refraction, the total reflection phenomenon and the like.

As shown in FIG. 13(b), when the width W of light becomes less than several tens times as small as the wavelength, the width t is no longer negligible. In this case, the closed line integral A is divided into B and C (see FIG. 13(c)). Of B and C, the closed line integral B is zero since the path is included in the luminous flux. In the remaining closed line integral C, only an integral value along a path PQ within the luminous flux takes a non-zero value since the electric or magnetic field vector is zero outside the luminous flux (see FIG. 13(d)). Therefore, the closed line integral C is not zero, i.e., this result of calculation is equivalent to light production within the closed loop. Moreover, when the width W of light becomes as small as about 1/10 of the wavelength, closed line integrals C and C' are close to each other and paths PQ and Q'P' overlap each other as shown FIG. 13(e). Therefore, the sum of the closed line integrals C and C' is zero, i.e., there is no light production within the closed loop.

On the other hand, it is assumed that light beams having a phase difference of $\pi$ are arranged side by side along the surface of refraction as shown in FIG. 13(f). A closed line integral A of the luminous flux is calculated as follows. Also in this case, when the width W of light becomes less than several tens times as small as the wavelength, the width t is no longer negligible. In this case, the closed line integral A is divided into B, C and B' (see FIG. 13(g)). Of them, the closed line integrals B and B' are zero because their closed paths are included in the luminous flux. Of the remaining closed line integral C, components along the surface of refraction are negligible, and only integral values along paths PQ and Q'P' extending along a boundary between the two luminous flux regions take non-zero values (see FIG. 13(h)). The integral along the path Q'P' where the phase of luminous flux is $\pi$ is equal to an integral along the path P'Q' where the phase of luminous flux is 0. Therefore, the closed line integral C is twice as large as the integral along the path PQ. This result of calculation is equivalent to light production in the closed loop. Therefore, in addition to a case where light has a narrow width, even when light beams having different phases are arranged side by side with a narrow width being interposed therebetween, light is produced in the vicinity of a boundary of the width (light is not actually emitted, and there effectively exists the same behavior as light production, and this phenomenon is similar to a phenomenon called boundary diffraction proposed by Young before the establishment of a diffraction theory and therefore referred to as a boundary diffraction effect).

When light is produced on the surface of refraction T, the light propagates in both media sandwiching the surface of refraction, no matter what conditions under which light enters the surface of refraction are. In other words, it is considered that, even when light enters the surface of refraction at an angle larger than or equal to the critical angle, then if light is mathematically produced on the surface of refraction, light is transmitted through the surface of refraction without total reflection. Therefore, according to these results of studies, the present inventors have studied a structure of a surface of refraction for actually generating the phenomenon that light is transmitted through the surface of refraction even at an angle exceeding the critical angle.

Figure 20:
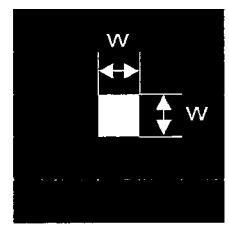
FIG. 20(a) is a diagram showing an arrangement of a pinhole.
FIG. 20(b) is a diagram showing an arrangement of phase shifters.
Figure 20:
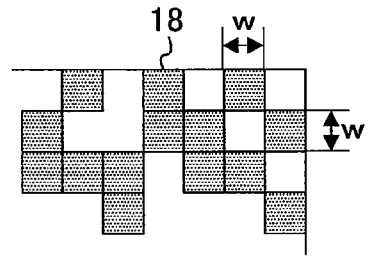

FIG. 20 shows examples in which the boundary diffraction effect is significantly exhibited. FIG. 20(a) shows an example in which a pinhole is provided at an interface between a transparent substrate provided on a light emitting element and air, and regions other than the pinhole are shielded from light, whereby pinhole light is obtained (light exists only in □w). FIG. 20(b) shows an example in which 180-degree phase shifters 18 are randomly arranged on squares having a width w of a grid pattern. The present inventors first studied the pinhole. However, the amount of light extracted from the pinhole was actually considerably small. Therefore, the phase shifters randomly arranged, which are considered to have the same light extraction characteristics as those of the pinhole, were also studied.

Figure 21:
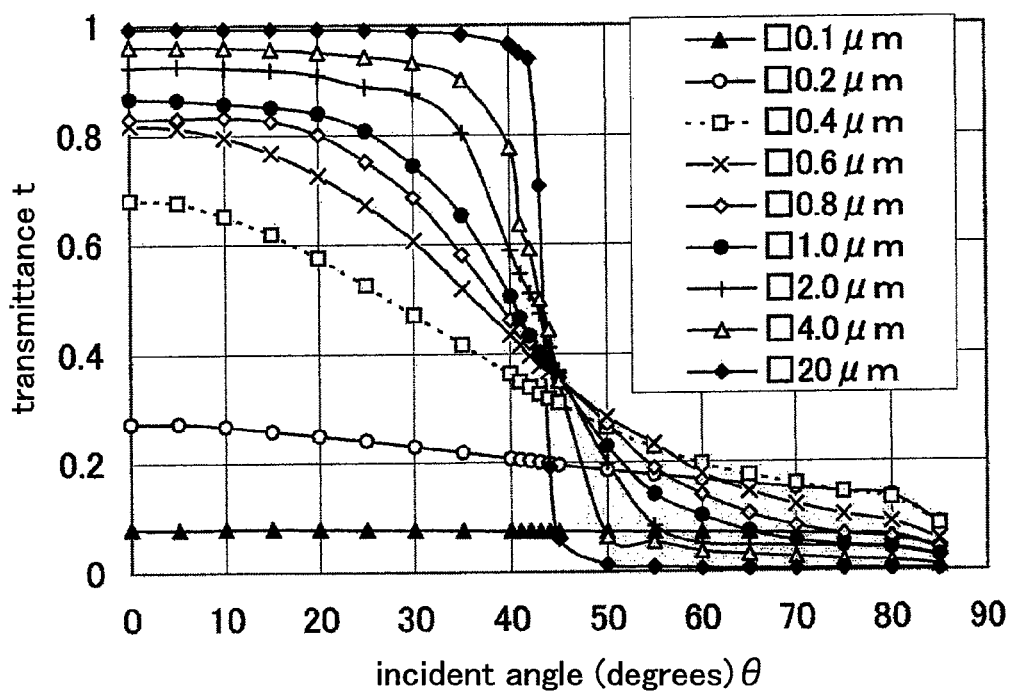
FIG. 21 is a diagram showing transmittances with respect to incident angles in a surface of refraction in which 180-degree phase shifters are randomly arranged.

FIG. 21 is a diagram for describing the incident angle dependency of a transmittance t at the surface of refraction in the structure of FIG. 20. FIG. 21 shows what amount of light is emitted into air when light enters an interface between a transparent substrate and the air at an angle $\theta$ (angle from the normal to a surface of refraction) in the transparent substrate, where the wavelength of the light is 0.635 µm, the refractive index of the transparent substrate is 1.457, the light has a light amount of one, and the width w is a parameter (w=0.1, 0.2, 0.4, 0.6, 0.8, 1.0, 2.0, 4.0 and 20.0 µm) (the pinhole light and the 180-degree phase shifter have perfectly the same characteristics, and therefore, the 180-degree phase shifter is used instead of the pinhole light). When w=20 µm, which is close to the conditions of FIG. 13(a), characteristics are that the transmittance becomes substantially zero when the incident angle exceeds the critical angle (43.34 degrees). When w becomes as small as 0.4 to 1.0 µm, large transmittances are obtained even when the incident angle exceeds the critical angle, because of the boundary diffraction effect described in FIGS. 13(d) and (h). When w is further decreased (w=0.1 and 0.2 µm), the transmittance is closer to zero at all incident angles as described in FIG. 13(e). Note that the analytical result of FIG. 21 is based on the Helmholtz wave equation (so-called scalar wave equation), and therefore, there is no difference between p-polarized light and s-polarized light.

Figure 25:
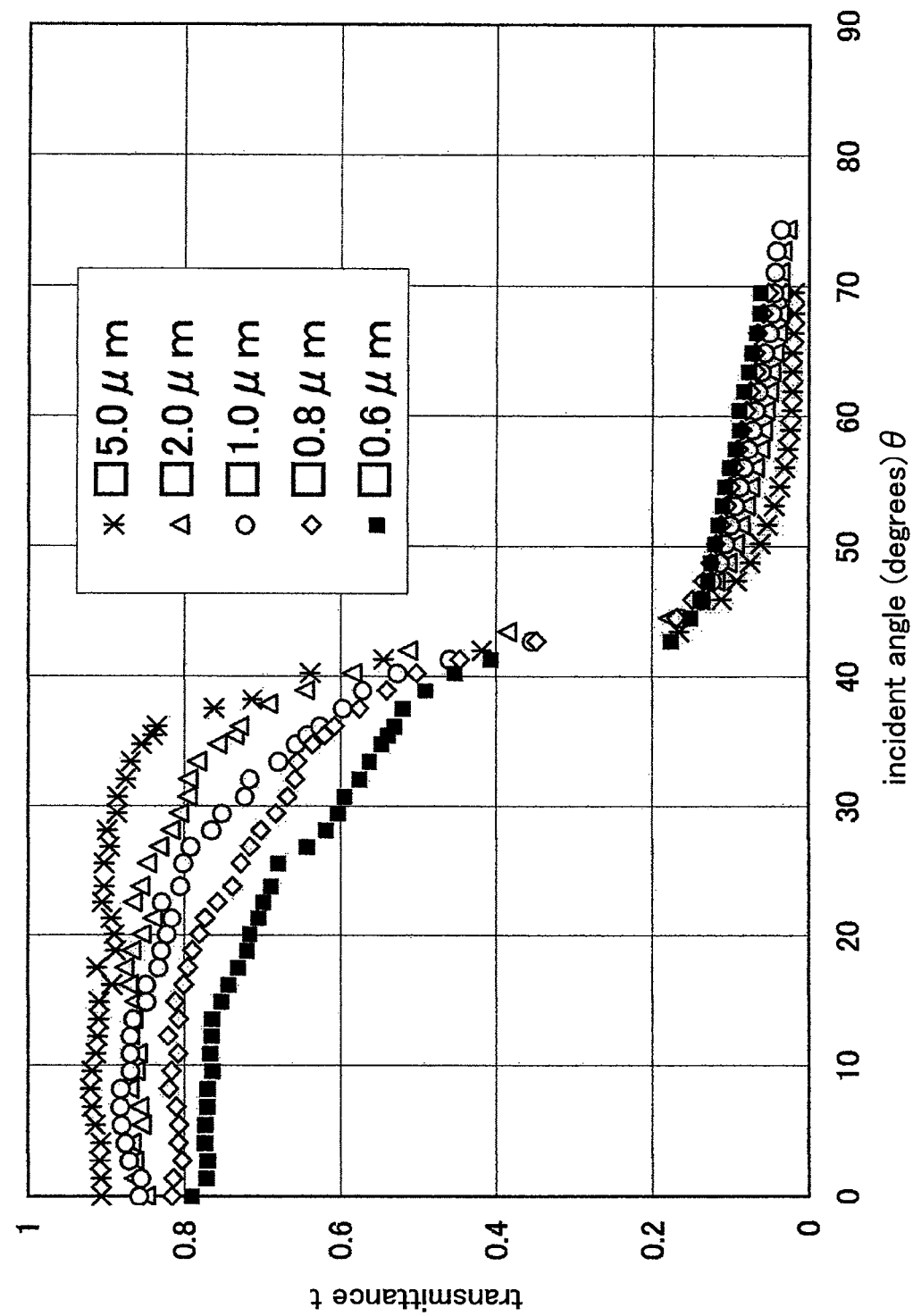
FIG. 25 is an experimental diagram for describing transmittances with respect to incident angles of a surface of refraction in which 180-degree phase shifters are randomly arranged.
Figure 26:
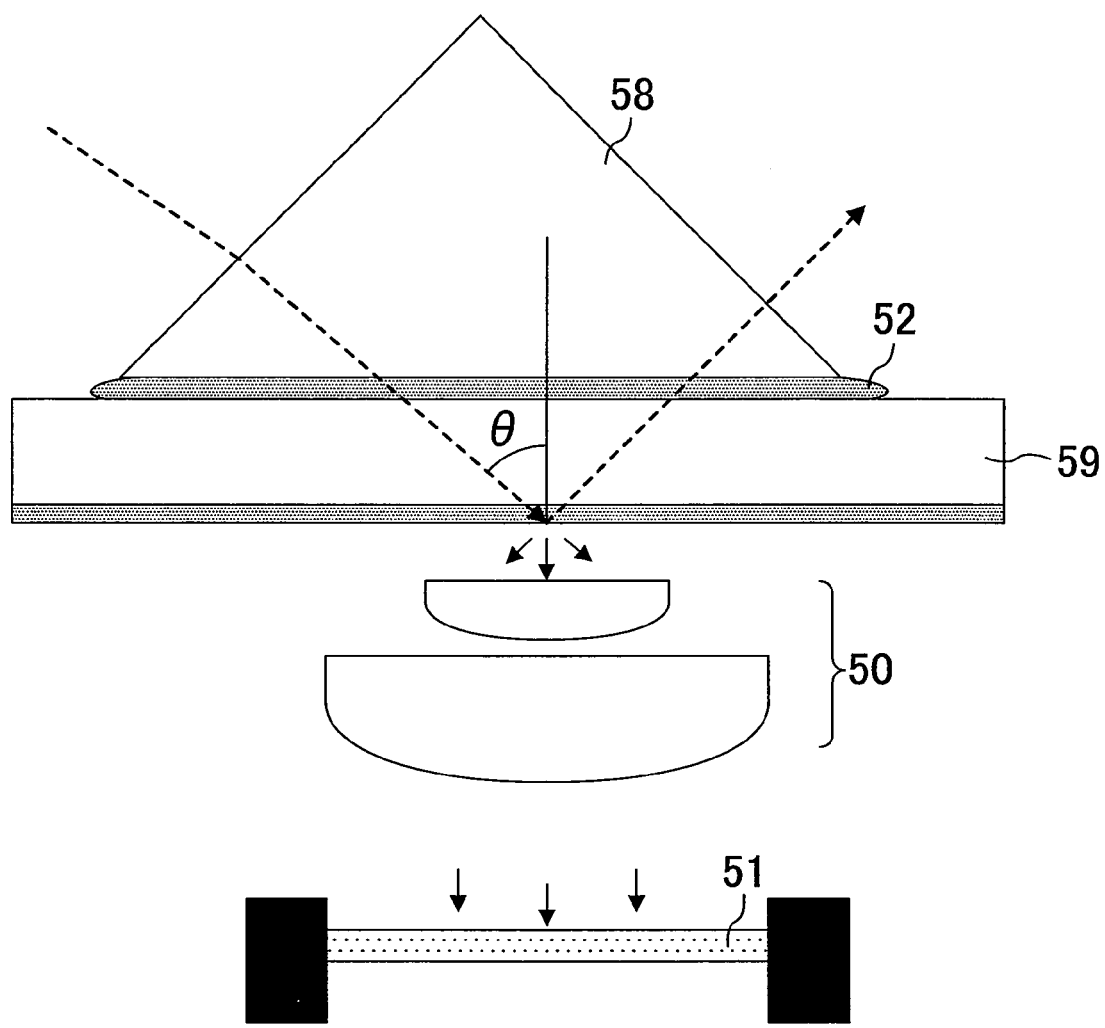
FIG. 26 is a diagram showing a structure of an experimental apparatus for measuring a transmittance with respect to an incident angle.

FIG. 25 shows experimental results indicating the incident angle dependency of the transmittance t when p-polarized light enters at the first time. It is actually difficult to fabricate the minute phase shifter 18. Therefore, instead of this, a mask which is transparent for portions of a phase of 0 degrees and is shielded with a light shielding film (Cr film) for portions of a phase of 180 degrees (a random arrangement of light shielding film patches on squares having a width w of a grid pattern, which is equivalent to a random arrangement of pinhole light beams) was used to conduct an experiment. Mask patterns actually produced had a width w of 0.6, 0.8, 1.0, 2.0 and 5.0 µm. An experimental apparatus includes, as shown in FIG. 26, a semiconductor laser (wavelength: 0.635 µm), a triangular optical prism 58 (BK7), a mask substrate 59 (synthetic quartz, the refractive index is 1.457, and a mask pattern is formed on the rear surface), a condenser lens system 50, and a photodetector 51. The triangular optical prism is attached to the front surface of the mask substrate with a matching solution 52 having a refractive index of 1.51 being interposed therebetween. Laser light is caused to enter from a triangular optical prism side while the direction angle thereof is measured, transmitted light leaking from the rear surface is collected by the condenser lens system 50, and the amount of the transmitted light is measured by the photodetector 51. In the case of the mask, light is blocked by the light shielding film portion corresponding to ½ of the total area, and therefore, the amount of the transmitted light is ½ as compared to when a phase shifter is used. Therefore, the transmittance t is normalized using the amount of light entering the non-light shielding film portion (½ of the total light amount). The experimental result satisfactorily agrees with the analytical result of FIG. 21. It can be seen that large transmittances are obtained even when the incident angle exceeds the critical angle (43.34 degrees), and this tendency increases as w decreases.

Based on such results, the present inventors have made further studies to achieve a novel light emitting device which prevents total reflection to dramatically improve light extraction efficiency.

Hereinafter, embodiments of the present invention will be described in detail with reference to the drawings. In the drawings described below, components having substantially the same function are indicated by the same reference symbols for the sake of simplicity.

First Embodiment

A first embodiment will be described with reference to FIGS. 1 to 5(a), 5(b), 28 and 29.

Figure 1:
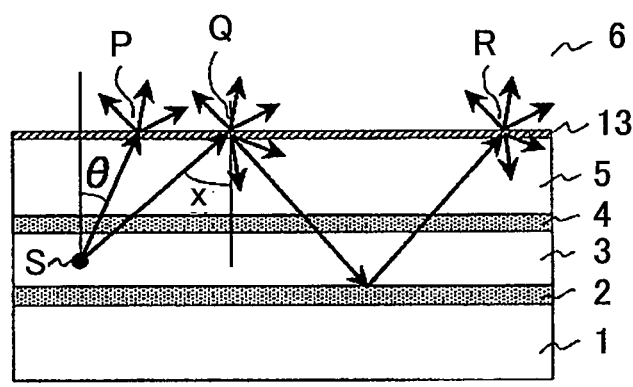
FIG. 1 is a diagram showing a cross-sectional structure of a light emitting device employing an organic electroluminescence element in a first embodiment and how light propagates through the light emitting device.

FIG. 1 shows a cross-sectional structure of a light emitting device employing an organic EL element in the first embodiment and how light propagates through the light emitting device. An electrode 2, a light emitting layer 3, and a transparent electrode 4 are laminated in this stated order on a substrate 1. A transparent substrate (transparent protective layer) 5 is provided on the transparent electrode 4. The substrate 1, the electrode 2, the light emitting layer 3, and the transparent electrode 4 constitute a light emitting element. A surface structure 13 having minute concave and convex portions (minute segmented regions) are formed in a surface of the transparent substrate 5.

When a voltage is applied between the electrode 2 and the transparent electrode 4, light is produced at a point S in the light emitting layer 3. The light is transmitted through the transparent electrode 4 directly or after being reflected by the electrode 2, enters a point P on the surface structure 13 in the surface of the transparent substrate 5 at an angle θ from the surface normal to the surface, and is diffracted at this point by the surface structure 13 and emitted into an air layer 6.

Let $n_0$ and $n_1$ be the refractive indices of the air layer 6 and the transparent substrate 5, respectively. When the incident angle θ exceeds a critical angle $\theta_c = \sin^{-1}(n_0/n_1)$, total reflection should happen. However, since the surface structure 13 is provided on the surface of the transparent substrate 5, light which enters a point Q at an angle larger than or equal to the critical angle $\theta_c$ is diffracted without being totally reflected, and is emitted into the air layer 6 (first light extraction). Note that a portion of light is reflected at the point Q, and the reflected component is reflected by the electrode 2, and thereafter, enters the surface structure 13 again at a point R, and a portion of the light is emitted into the air layer 6 (second light extraction) while the remainder is reflected. This process is infinitely repeated.

In the case of a conventional light emitting device employing a organic EL element which does not include the surface structure 13, light which enters from the transparent substrate side to an interface between the transparent substrate and the air layer at an angle larger than or equal to the critical angle, is totally reflected, and is then reflected by the electrode. The reflected light enters the interface between the transparent substrate and the air layer again at an angle larger than or equal to the critical angle again. Therefore, the second light extraction and thereafter do not occur, in which the conventional art is different from this embodiment.

Hereinafter, the surface structure 13, which is a feature of this embodiment, will be described in detail.

Figure 2:
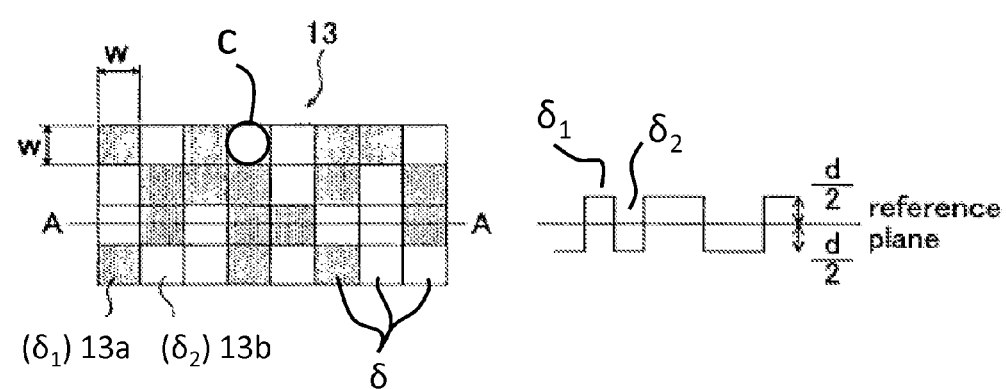
FIG. 2(a) is a partially enlarged view of the surface structure of the first embodiment.
FIG. 2(b) is a pattern diagram having a wider range.
Figure 2:
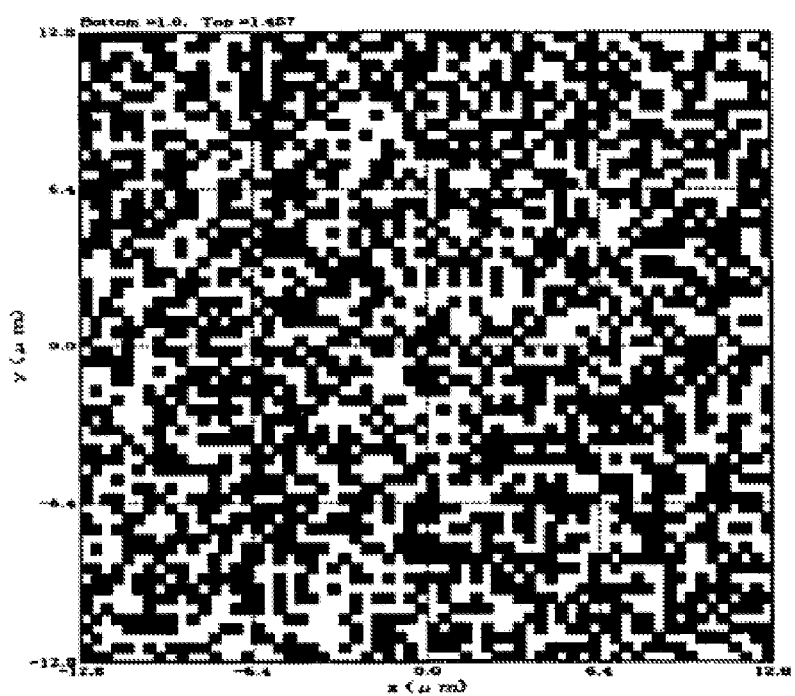

FIG. 2 is a diagram showing a pattern of the surface structure 13 in the first embodiment. FIG. 2(a) shows a top view on the left side and a cross-sectional view taken along line A-A of the top view on the right side. As shown in FIG. 2(a), the surface structure 13 is obtained by virtually dividing the surface of the transparent substrate 5 into squares (minute regions δ) having a width w (referred to as a boundary width) of a grid pattern, where there is no gap between each square. Each square (minute region δ) is convex (13a (minute region $\delta_1$), a gray square in FIG. 2) or concave (13b (minute region $\delta_2$), a white square in FIG. 2) relative to the convex shape. The ratio of the convex squares to the concave squares is about 50:50, and the convex and concave squares are randomly arranged. FIG. 2(b) shows an example where w=0.4 μm (black squares are convex and while squares are concave). The convex portion has a projection height d with reference to a bottom of the concave portion. Specifically, one minute region δ is adjacent to and surrounded by a plurality of other minute regions δ, and the minute region $\delta_1$ projects further toward a position above the surface of the transparent substrate 5 than the minute region $\delta_2$. Here, a reference plane which is parallel with the surface of the transparent substrate 5 is defined at a middle position between the minute regions $\delta_1$ and $\delta_2$ in a direction perpendicular to the surface of the transparent substrate 5. In this case, the minute region $\delta_1$ projects by d/2 from the reference plane, and the minute region $\delta_2$ dents by d/2 from the reference plane. In other words, a plurality of dent portions (white portions) are provided in an interface between the transparent substrate 5 and the air 6, and the upper surfaces of portions other than the dent portions are provided on the same plane. All the dent portions have substantially the same depth d. The bottom surface of the dent portion is here referred to as a first reference plane. The first reference plane is virtually divided into a plurality of minute regions δ having the same area of $1.5 \times 1.5$ μm² or less. The bottom surface of the dent portion has a shape including two or more contiguous minute regions δ or a single minute region δ. It can also be said that the dent portions are randomly arranged on the first reference plane. Note that the first reference plane is different from the aforementioned reference plane.

The surface structure 13 may be formed as follows: a die having concave and convex portions which are formed by etching is fabricated; this shape is transferred to a sheet-like resin by pressing; and the sheet is attached to the transparent electrode 4 with the transparent substrate 5 as an adhesion layer being interposed therebetween. In this case, the transparent substrate 5 is a transparent sheet. Alternatively, concave and convex portions may be directly formed in a surface of a sheet or the surface of the transparent substrate 5 which is formed as a protective layer, by etching or the like.

Figure 28:
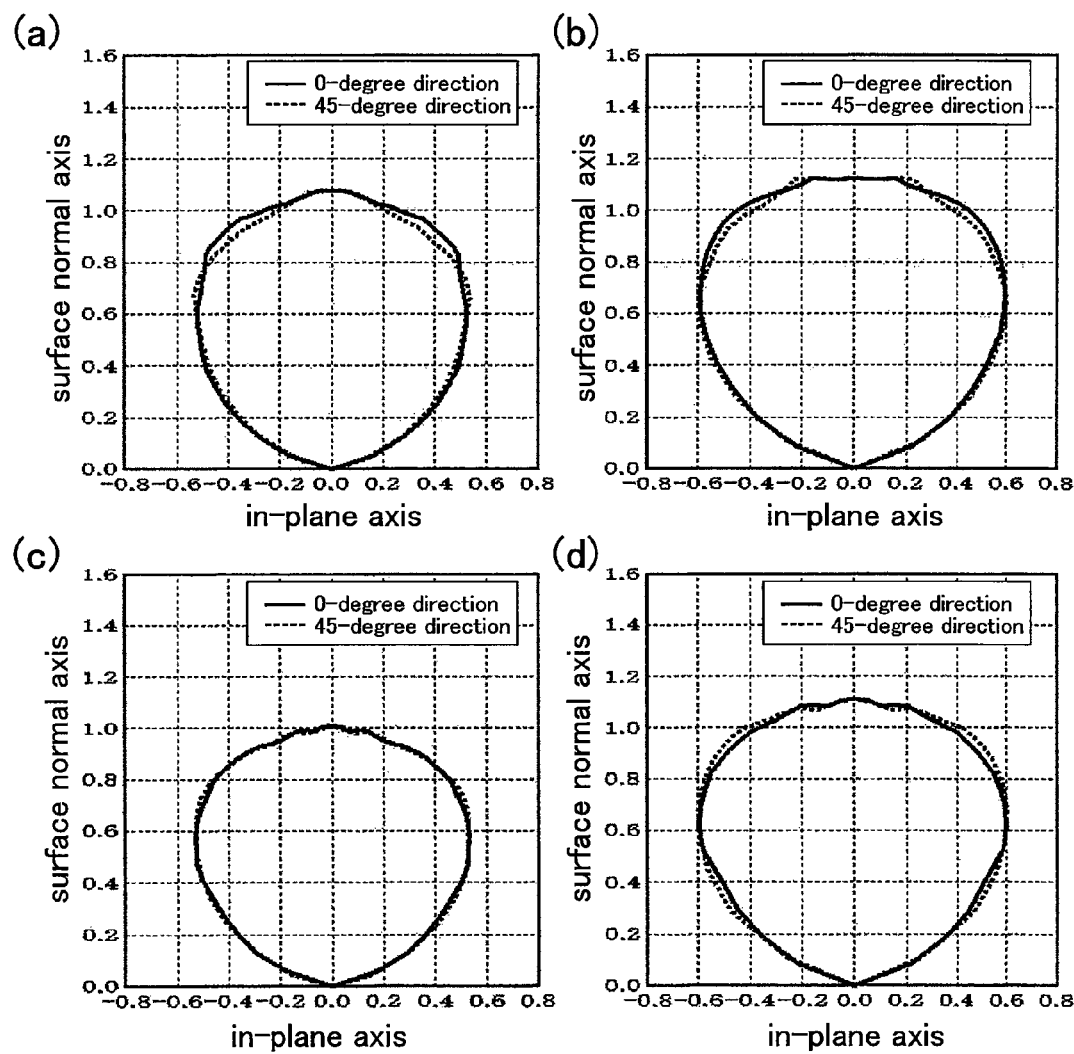
FIG. 28 is a diagram for describing the viewing angle dependency of light emitted from the surface structure of the first embodiment.
Figure 29:
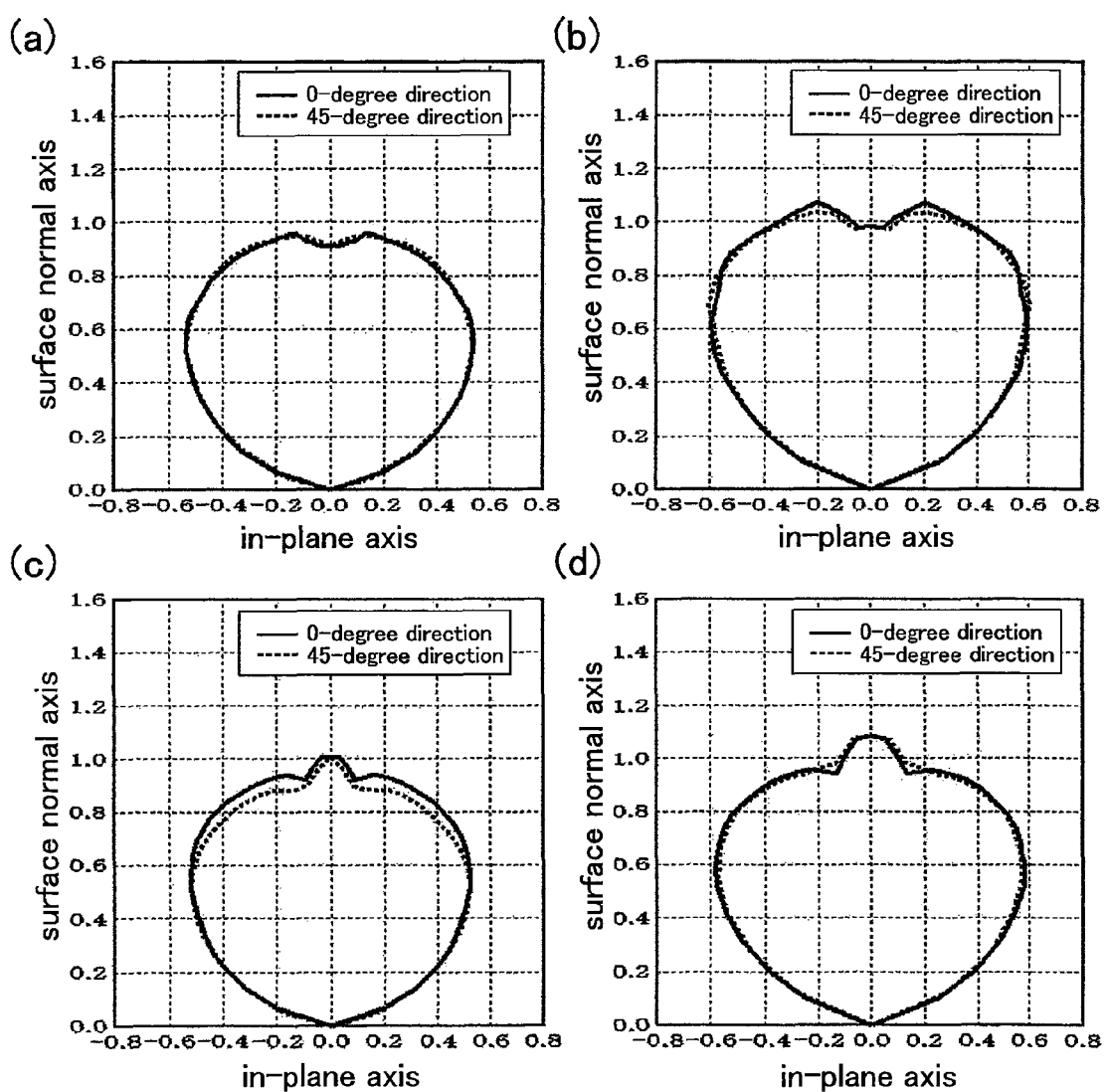
FIG. 29 is a diagram for describing the viewing angle dependency of light emitted from the surface structure of the first embodiment.

Light beams which are diffracted by such a random pattern also have random propagation directions. Therefore, as is different from the light emitting device described in Patent Document 1, there is not a distribution of light intensity varying depending on the direction, and also, there is not an imbalance in color between directions. Moreover, light entering from the outside (the air layer side) is reflected by the surface structure 13 in the surface of the transparent substrate 5. However, this reflected light is diffracted in random directions, so that ambient light reflection is prevented. Therefore, an optical treatment, such as an anti-reflection film or the like, is no longer required, whereby product cost can be suppressed to a low level. FIGS. 28 to 29 are diagrams showing analytical results of the viewing angle dependency of light which is emitted from the surface structure and is obtained by first light extraction, according to the first embodiment, where the difference in level is assumed to be d=0.7 μm, and the wavelength λ and the boundary width w are parameters. Each figure has the following conditions. In FIG. 28(*a*), λ=0.450 μm and w=0.5 μm. In FIG. 28(*b*), λ=0.635 μm and w=0.5 μm. In FIG. 28(*c*), λ=0.450 μm and w=1.0 μm. In FIG. 28(*d*), λ=0.635 μm and w=1.1 μm. In FIG. 29(*a*), λ=0.450 μm and w=1.5 μm. In FIG. 29(*b*), λ=0.635 μm and w=1.5 μm. In FIG. 29(*c*), λ=0.450 μm and w=2.0 μm. In FIG. 29(*d*), λ=0.635 μm and w=2.0 μm. A vector connecting the origin and a point on a curve represents the light intensity and the emission direction of emitted light. Specifically, the length of the vector corresponds to the light intensity, and the direction of the vector corresponds to the emission direction. The vertical axis corresponds to the direction of a surface normal axis, and the horizontal axis corresponds to the direction of an in-plane axis. A solid line indicates characteristics in a cross-section (longitudinal direction: 0 degrees, 90 degrees) where the in-plane axis extends along the x- or y-axis of FIG. 2(*b*), and a dashed line indicates characteristics in a cross-section (longitudinal direction: 45 degrees, 135 degrees) where the in-plane axis extends along a line y=x or y=−x (the results of the 90- and 135-degree directions are the same as those of the 0- and 45-degree directions, and therefore, are not shown). When the boundary width w=0.5, 1.0 μm, both the solid line and the dashed line indicate smooth changes with respect to declinations (latitudes) (i.e., parallax causes only small changes in intensity), and match each other. When w is large, i.e., w=2.0 μm, there are large changes in intensity with respect to declinations in the vicinity of the surface normal direction, and therefore, the solid line and the dashed line significantly differ from each other at λ=0.450 μm. The width w=1.5 μm is a minimum value at which the intensity changes. Therefore, it can be seen that a viewing angle dependency where the light intensity in the surface normal direction is large, a change in declination (latitude) is gentle, and a difference in light intensity in the longitudinal direction is small, is obtained under conditions that the boundary width w is 1.5 μm or less.

Figure 3:
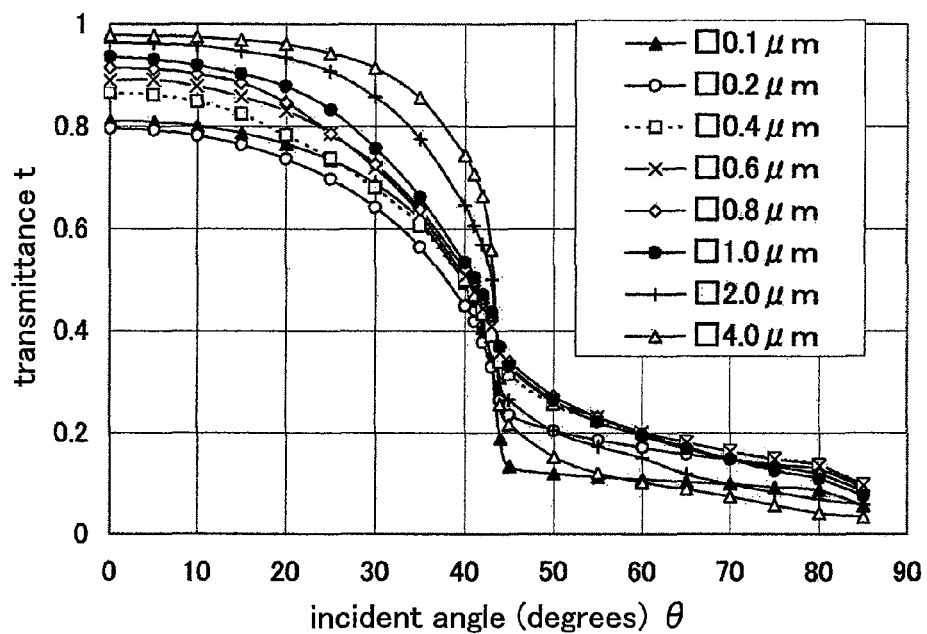
FIG. 3 is a diagram for describing the incident angle dependency of a transmittance t of the surface structure of the first embodiment.
Figure 3:
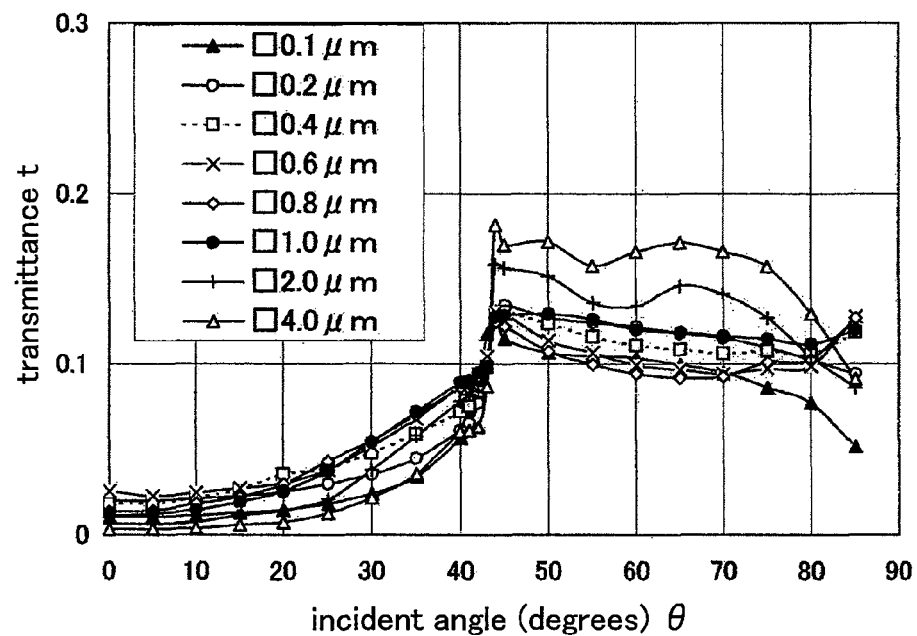

FIG. 3 is a diagram for describing the incident angle dependency of the transmittance t of the surface structure 13 in the first embodiment. FIG. 3(*a*) shows what amount of light is emitted into the air 6 by first light extraction after light having a light amount of one enters the surface structure at an angle θ (angle from the normal to a surface of refraction) in the transparent substrate 5. FIG. 3(*b*) shows the incident angle dependency of the transmittance when light enters the surface structure 13 again after being reflected by the surface structure 13 and then the electrode 2, i.e., during second light extraction. In both of FIGS. 3(*a*) and 3(*b*), it is assumed that the refractive index of the transparent substrate 5 is $n_1$=1.457, the refractive index of the air 6 is $n_0$=1.0, the wavelength of light is λ=0.635 μm, the projection height of the minute region $\delta_1$ from the minute region $\delta_2$ is d=0.70 μm, and the proportion of the area of the minute region $\delta_1$ (i.e., the proportion of the convex portions) is P=0.5, and the width w of the surface structure is a parameter (w=0.1, 0.2, 0.4, 0.6, 0.8, 1.0, 2.0 and 4.0 μm). Note that the projection height d=0.70 μm corresponds to conditions (d=λ/2($n_1$−$n_0$)) under which, when light enters perpendicularly, light transmitted through the concave portion and light transmitted through the convex portion have a phase difference of π.

Figure 24:
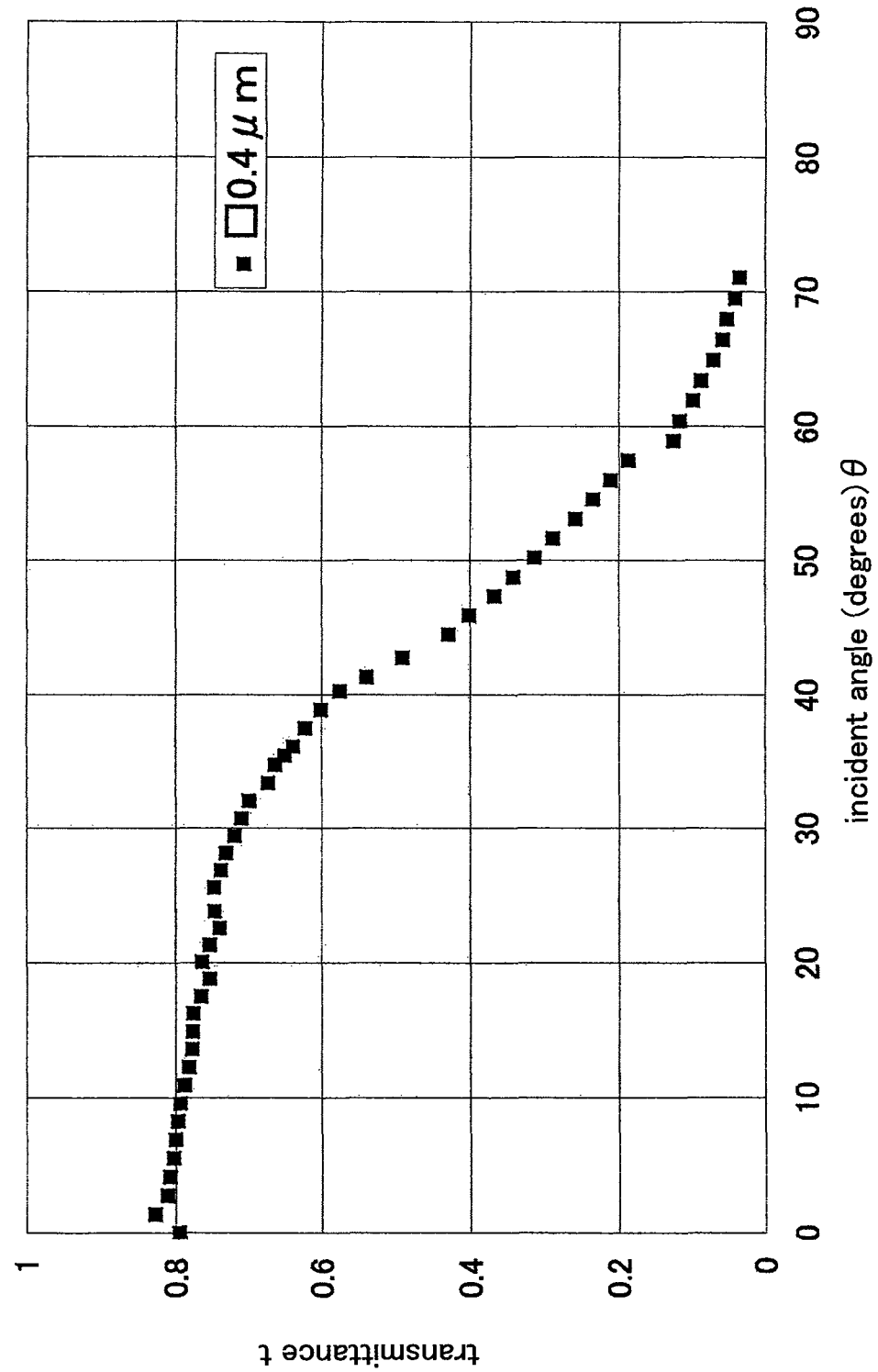
FIG. 24 is an experimental diagram for describing the incident angle dependency of a transmittance t of the surface structure of the first embodiment.

The result of FIG. 3(*a*) is close to that of the 180-degree phase shifter (FIG. 21) where large transmittances are obtained for incident angles exceeding the critical angle, except for w=0.1 and 0.2 μm. FIG. 24 shows an experimental result indicating the incident angle dependency of the transmittance t of p-polarized incident light. An experiment was actually conducted in which a random concave-and-convex pattern having a depth d=0.70 μm and a boundary width w=0.4 μm was formed on a quartz substrate by an electron beam technique, and the measuring apparatus of FIG. 26 was used. The experimental result satisfactorily agrees with the analytical result of FIG. 3(*a*), i.e., it can be seen that large transmittances are obtained even for incident angles exceeding the critical angle (43.34 degrees). As described before this embodiment, no matter what conditions under which light enters the surface of refraction are, if equivalent light production (so-called boundary diffraction effect) occurs on the surface of refraction, the light propagates in both media sandwiching the surface of refraction. The phenomenon that light is transmitted at an angle exceeding the critical angle as shown in FIG. 3 can be explained by the conditions under which equivalent light production occurs on the surface of refraction.

Figure 4:
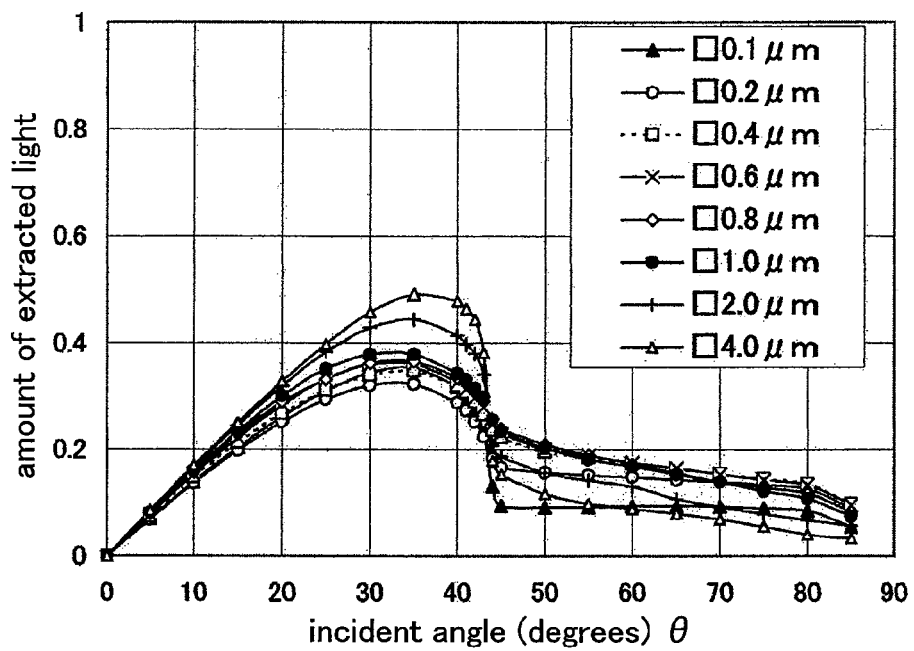
FIG. 4 is a diagram for describing the incident angle dependency of the amount of extracted light of the surface structure of the first embodiment.
Figure 4:
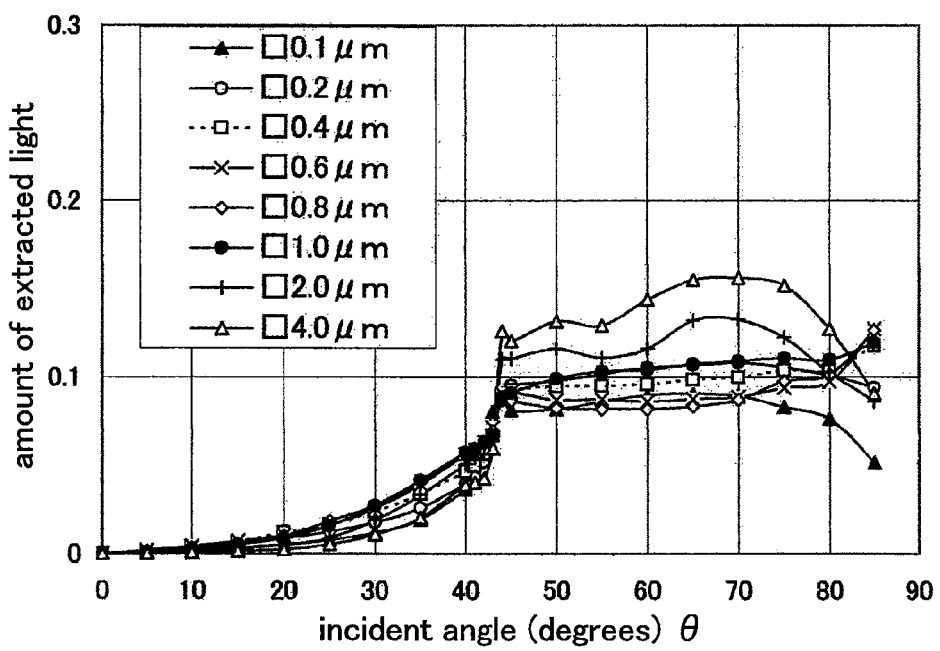

If it is assumed that light emitted from a point uniformly diffuses as a spherical wave in the transparent substrate 5, the total amount of light between a light emission direction angle θ (equal to the aforementioned incident angle θ) and θ+dθ is proportional to sin θdθ. Therefore, the amount of extracted light is proportional to the product of the transmittance t of FIGS. 3(*a*) and (*b*) and sin θ. FIGS. 4(*a*) and 4(*b*) are diagrams for describing the incident angle dependency of the amount of extracted light at the surface structure of the first embodiment. Specifically, FIG. 4(*a*) shows what amount of light is emitted into the air layer 6 by first light extraction after light having a light amount of one emitted from a point in the transparent substrate 5 (actually, a point in the light emitting layer) enters the surface structure at an angle θ (angle from the normal to the surface of refraction). FIG. 4(*b*) shows the incident angle dependency of the amount of extracted light which enters the surface structure 13 again after being reflected by the surface structure 13 and then the electrode 2, i.e., during second light extraction.

Figure 5:
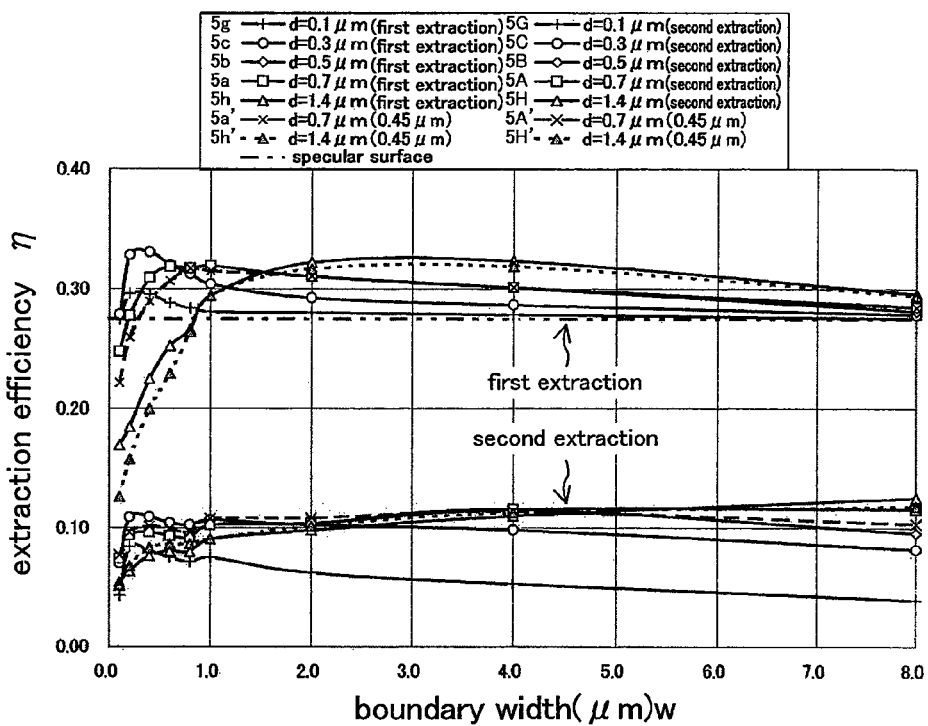
FIG. 5 is a diagram for describing the light extraction efficiency of the surface structure of the first embodiment.
Figure 5:
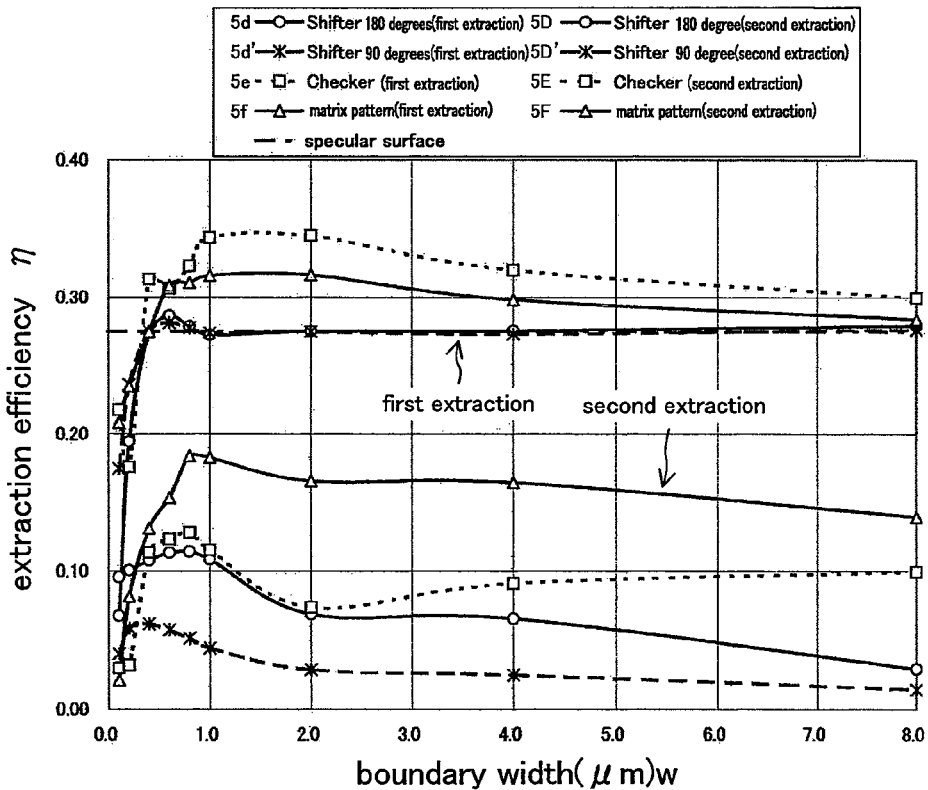

A light extraction efficiency is obtained by integrating the amount of extracted light over the incident angle θ. FIGS. 5(*a*) and 5(*b*) are diagrams for describing the light extraction efficiency of the surface structure 13 in the first embodiment, under the same conditions as those of FIG. 3, where the horizontal axis represents the boundary width w of the surface structure 13. FIG. 5(*a*) shows light extraction efficiencies when the projection height of the surface structure 13 is d=0.70 μm and, in addition, d=0.1, 0.30, 0.50 and 1.40 μm (first-light extraction efficiencies $\eta_1$), and moreover, light extraction efficiencies when light is reflected by the surface structure 13 and then the electrode 2 before entering the surface structure 13 again, where it is assumed that the light is not attenuated due to absorption by the transparent electrode 4, loss by reflection at the electrode 2, or the like when traveling back and forth (second-light extraction efficiencies $\eta_2$). Curves 5*a* and 5A indicate first- and second-light extraction efficiencies, respectively, where d=0.70 μm. Curves 5*b* and 5B indicate first- and second-light extraction efficiencies, respectively, where d=0.50 μm. Curves 5*c* and 5C indicate first- and second-light extraction efficiencies, respectively, where d=0.30 μm. Curves 5*g* and 5G indicate first- and second-light extraction efficiencies, respectively, where d=0.10 μm. Since the light extraction efficiencies indicated by curves 5*g* and 5G are lower than those of the other depths, the projection height d needs to be 0.20 μm or more. Curve 5*h* shows that when the projection height d is twice or more as large as the wavelength of visible light (d≧1.4 μm), the first efficiency significantly decreases in a region where the width w is 1.5 µm or less. Therefore, the projection height d is preferably 1.4 µm or less. Therefore, a recommended value of d is within the range of 0.2 to 1.4 µm. More generally, a recommended value of the level difference is one that satisfies conditions that $\lambda/(n_1-n_0) \geq d \geq \lambda 6(n_1-n_0)$, where $n_1$ represents the refractive index of the transparent substrate 5, $n_0$ represents the refractive index of the air 6, and $\lambda$ represents the center wavelength of light.

When $d \leq 0.70$ µm, all the first-light extraction efficiencies become maximum when the boundary width w is 0.4 to 2 µm. As w is decreased or increased from that point, each first-light extraction efficiency asymptotically approaches 0.27 (a value given by Expression 3, i.e., a light extraction efficiency when the surface is considered as a specular surface). All the second-light extraction efficiencies become maximum at w=0.10 to 2.0 µm. As w is increased from that point, each second-light extraction efficiency asymptotically approaches 0.00 (does not appear within the range of FIG. 5). When $w \leq 0.10$ µm, each second-light extraction efficiency converges to 0.00 as w is decreased.

For reference, FIG. 5(b) shows curves 5d and 5D indicating first- and second-light extraction efficiencies when a phase shifter for changing the phase of light by 180 degrees is provided in the minute region $\delta_1$ instead of the surface structure 13. In the surface structure 13 of this embodiment, a phase difference occurs when light beams propagating the concave and convex portions travel over a distance corresponding to the level difference. On the other hand, in the phase shifter, the propagation distance is zero, and a phase difference is virtually generated. In the case of the phase shifter, as the boundary width w is increased, the first- and second-light extraction efficiencies asymptotically approach 0.27 and 0.00, respectively, as in the case of the surface structure 13. However, as the boundary width w is decreased to 0.3 µm or less, the first-light extraction efficiency as well as the second-light extraction efficiency becomes zero (the reason is already described with reference to FIG. 13(e)). One of the reasons why the surface structure 13 of this embodiment can provide a higher light extraction efficiency than that of the phase shifter under the conditions that the boundary width is 0.4 µm or less, may be that the convex portion functions as an optical waveguide.

Let $\tau$ be a light transmittance of the transparent substrate 5 when light travels back and forth between the surface of the transparent substrate 5 and the electrode 2. The second-light extraction efficiency is $\tau \times \eta_2$, where attenuation of light traveling back and forth is taken into consideration. Light extraction is not limited to first- and second-light extraction, and is infinitely repeated. If this relationship is represented by a geometric progression, then when the first-light extraction efficiency is $\eta_1$ and the second-light extraction efficiency is $\tau \times \eta_2$, the $n^{th}$-light extraction efficiency can be expected to be $\eta_1 \times (\tau \times \eta_2/\eta_1)^{n-1}$. Therefore, the sum of the amounts of light obtained by the first- to $n^{th}$-light extraction is given by:

$$\eta_1 \times \sum_{k=1}^{n} (\tau \times \eta_2/\eta_1)^{k-1} \quad \text{(Expression 6)}$$

Thus, when light extraction is infinitely repeated, the sum asymptotically approaches $\eta_1/(1-\tau \times \eta_2/\eta_1)$.

Figure 14:
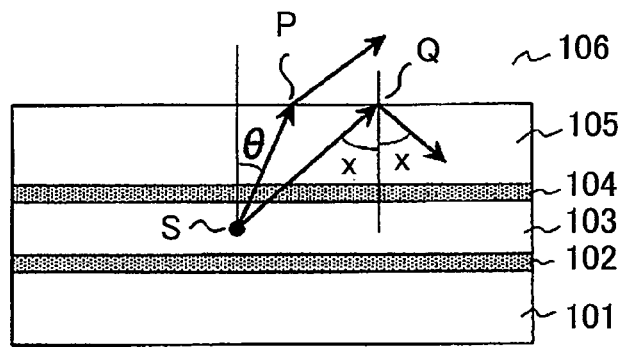
FIG. 14 is a diagram for describing a cross-section structure of an organic electroluminescence element and how light propagates therethrough.

In FIG. 5(a), in the case of curves 5a and 5A (d=0.70 µm), when w=0.60 µm, $\eta_1$=0.318 and $\eta_2$=0.093. In this case, if $\tau$=0.88, the light extraction efficiency is 0.428. When w=1.00 µm, $\eta_1$=0.319 and $\eta_2$=0.102, and the light extraction efficiency is 0.444. On the other hand, in the case of the conventional light emitting device of FIGS. 14 and 15(a), $\eta_1$=0.274 and $\eta_2$=0, i.e., the amount of extracted light is invariably zero during second light extraction and thereafter. Thus, the total sum is 0.274. Therefore, when w=0.60 µm, the light emitting device of this embodiment achieves a light extraction efficiency 1.56 times as high as that of the light emitting device of FIG. 15(a). When w=1.00, the light extraction efficiency is 1.62 times as high. Thus, if w is set to be larger than 0.2 µm (more generally, the diameter of a largest circle 1"C" in FIG. 2(a)) inscribed in the minute region $\delta$ is set to be 0.2 µm or more), the light extraction efficiency can be significantly improved.

Next, it will be discussed how the light extraction efficiency of the surface structure 13 in this embodiment depends on the wavelength.

In FIG. 5(a), curves 5a', 5A', 5h' and 5H' indicate first- and second-light extraction efficiencies for d=0.70 and 1.40 µm under conditions that the wavelength is 0.45 µm. These characteristics are substantially the same as those of the results when the wavelength is 0.635 µm. Therefore, it can be seen that a change in extraction efficiency due to a difference in wavelength between visible light beams can be reduced.

Thus, the surface structure 13 of this embodiment can provide a light extraction efficiency close to the optimal value for all wavelengths within the visible light range even for a single shape (d and w). Therefore, when this structure is applied to a display surface of a display apparatus, the shape of the structure does not need to be changed separately for three kinds of pixels of RGB. As a result, arrangement or adjustment during assembly can be significantly simplified.

Figure 22:
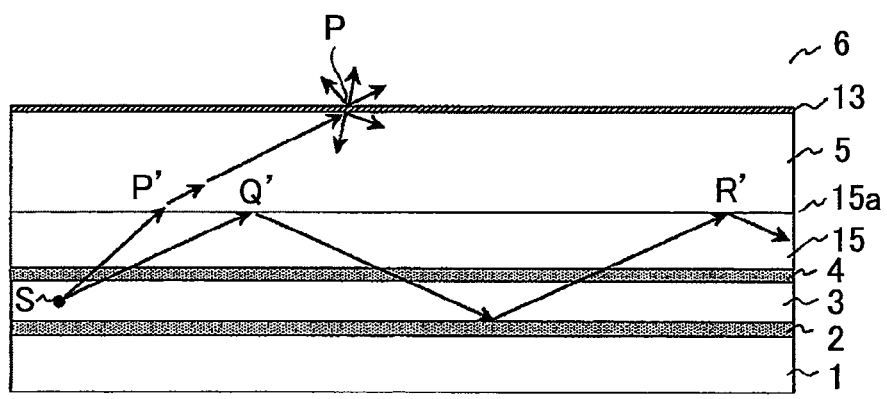
FIG. 22 is a cross-sectional view of a light emitting device having an adjustment layer.

Also, in an organic EL element, a transparent adjustment layer may be provided on the transparent electrode 4 so as to adjust a light transmittance when light travels back and forth between the transparent substrate 5 and the electrode 2. In this case, the transparent substrate 5 is provided on the adjustment layer (i.e., the organic EL element additionally including the adjustment layer can be considered as a light emitting element). When the refractive index $n_1$ of the transparent substrate 5 is smaller than the refractive index $n_1'$ of the adjustment layer, there is an interface between the transparent substrate 5 and the adjustment layer, where total reflection occurs. This influence is not negligible, particularly when $n_1'-n_1>0.1$. FIG. 22 shows how light propagates in this case.

In FIG. 22, light which is emitted at a point S in a light emitting layer 3 having a refractive index $n_2$ is transmitted through a transparent electrode 4 directly or after being reflected by an electrode 2, is transmitted through an adjustment layer 15 having a refractive index $n_1'$, is refracted at a point P' on an interface 15a, is transmitted through a transparent substrate 5 having a refractive index $n_1$, and is emitted through a point P on an interface between the transparent substrate 5 and air 6 into the air 6. Here, $n_1' \geq n_2 > n_1 > 1.0$. Note that $n_1'$ may be smaller than $n_2$. In this case, however, total reflection occurs between the transparent electrode 4 and the adjustment layer 15. In the transparent substrate 5, the surface structure 13 of this embodiment is formed in an interface with the air 6, which allows light entering at an angle exceeding the critical angle to be extracted into the air layer 6. However, since $n_1'>n_1$, total reflection also occurs at the interface 15a. Specifically, light entering a point Q' at an incident angle larger than that when entering a point P' is totally reflected, and the light is repeatedly totally reflected between the interface 15a and the electrode 2 and therefore cannot be extracted into the air 6.

Figure 23:
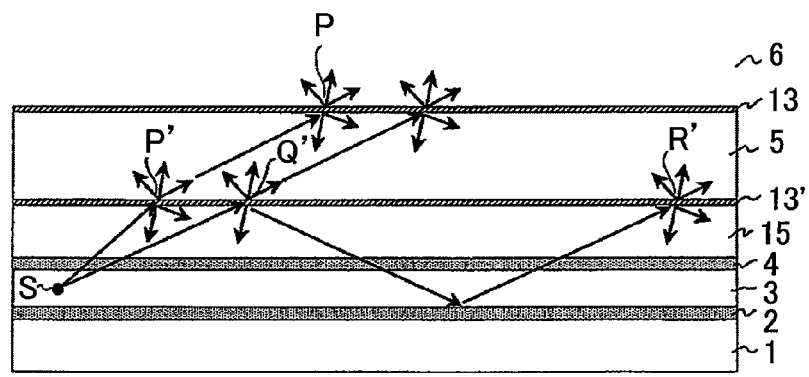
FIG. 23 is a cross-sectional view of a light emitting device in which a surface structure is also provided in a boundary with an adjustment layer.

In such a case, by providing a surface structure 13' according to this embodiment at an interface between the adjustment layer 15 and the transparent substrate 5 as shown in FIG. 23, light entering this surface at an angle exceeding the critical angle can be extracted into the air 6. Specifically, the surface structure 13' prevents light entering at the point Q' at an angle exceeding the critical angle from being totally reflected. A component reflected on this surface is reflected by the electrode 2 before entering the surface structure 13' again at a point R'. A portion of the component can be emitted through the surface structure 13 into the air 6. This process is infinitely repeated. Although the arrangement of FIG. 23 has the complexity that the two surface structures 13 and 13' having concave and convex portions are formed, a material having a low refractive index can be used for the transparent substrate 5, and therefore, it is advantageously possible to increase the range of choices of the material.

Note that, according to Expression 6, the light extraction efficiency increases with an increase in the light transmittance $\tau$ when light travels back and forth between the transparent substrate 5 and the electrode 2. An actual light emitting layer 3 is covered with a plurality of transparent layers (the adjustment layer 15, etc.) and the like in addition to the electrode 2 and the transparent electrode 4. These films should be designed (the refractive indices and thicknesses of films including the light emitting layer 3 should be determined) so that the light transmittance $\tau$ is maximized. In this case, reflection by the surface structure 13 allows a random phase distribution, resulting in incoherent superposition of reflected light beams (intensity addition rather than amplitude addition). Therefore, the influence of reflection by the surface of the transparent substrate 5 is negligible, so that a reflectance of 0% and a transmittance of 100% can be virtually achieved. The refractive index or thickness of each film is determined under conditions that light is emitted from the transparent substrate 5 under the aforementioned conditions, this light is caused to travel back and forth multiply through a multilayer film including the light emitting layer 3, and a light amount obtained by summation of the complex amplitudes of superposed light beams returned from the transparent substrate 5 is maximized.

Second Embodiment

Figure 6:
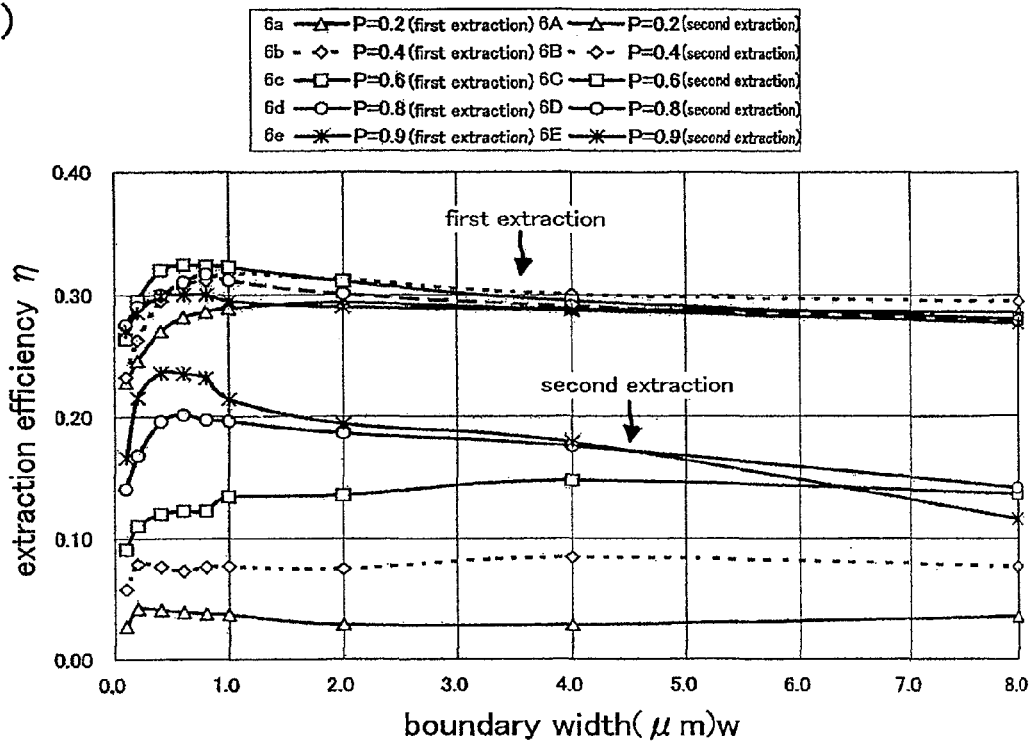
FIG. 6(a) is a diagram for describing the light extraction efficiency of a surface structure in a second embodiment.
FIG. 6(b) is a diagram for describing the light extraction efficiency of a surface structure in a third embodiment.
Figure 6:
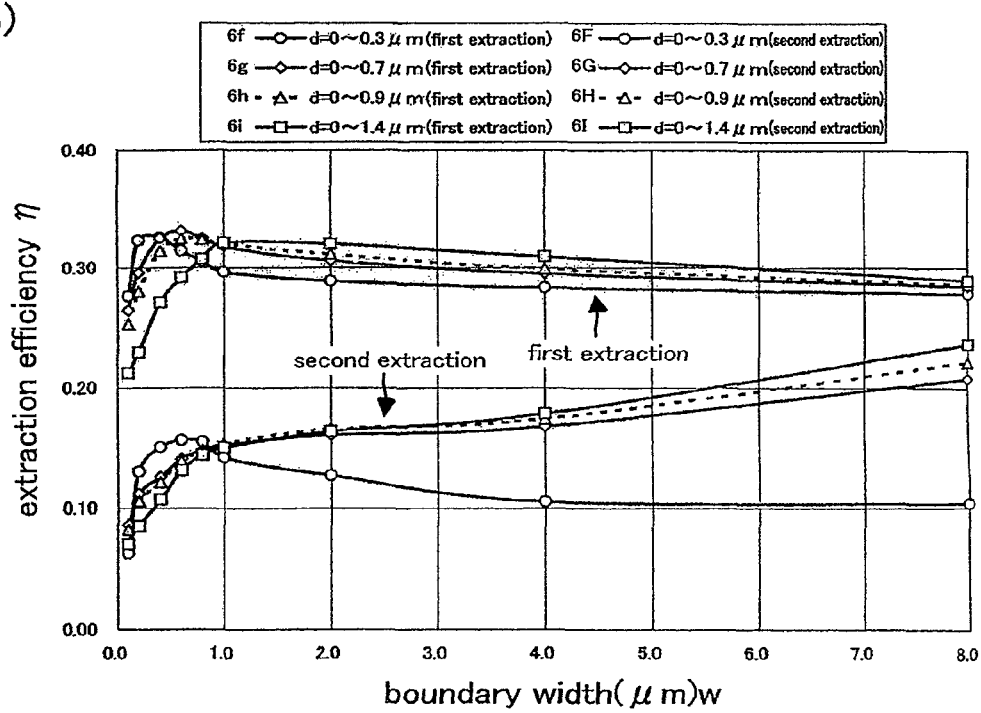

A second embodiment will be described with reference to FIGS. 6 and 27. Note that the second embodiment is different from the first embodiment only in the pattern of the surface structure 13. The other components of the second embodiment are all the same as those of the first embodiment. Those common components will not be described.

In the second embodiment, the proportion P of the convex portions of the surface structure and the proportion 1−P of the concave portions of the surface structure are not fixed to 0.5 and P is set to P=0.4 to 0.98. In other words, the minute regions $\delta_1$ (regions projecting upward) account for 40 to 98% of the surface structure while the minute regions $\delta_2$ (dent portions) account for 60 to 2% of the surface structure.

FIG. 6(a) is a diagram for describing the light extraction efficiency of the surface structure in this embodiment, where the refractive index of the transparent substrate 5 is $n_1$=1.457, the refractive index of the air 6 is $n_0$=1.0, the wavelength of light is $\lambda$=0.635 μm, and the projection height of the surface structure is d=0.70 μm. The horizontal axis represents the boundary width w of the surface structure. Light extraction efficiencies (first- and second-light extraction efficiencies) are shown for the proportions P=0.2, 0.4, 0.6, 0.8 and 0.9. Curves 6a, 6b, 6c, 6d and 6e and curves 6A, 6B, 6C, 6D and 6E indicate light extraction efficiencies at P=0.2, 0.4, 0.6, 0.8 and 0.9, respectively. Curves 27a and 27A of FIG. 27 are plots of light extraction efficiencies (first- and second-light extraction efficiencies) under the aforementioned conditions, where the boundary width w=1.0 μm and the horizontal axis represents the proportion P of the convex portions.

As can be seen from FIG. 6(a), for the first-light extraction efficiency, characteristics where the proportion P=0.2 take lowest values over the entire range of w, and characteristics where the proportion P=0.6 take highest values within the range of w≦2 g/m. For the second-light extraction efficiency within the range of w≦4 μm, characteristics where the proportion P=0.9 take highest values, and the characteristics where the proportion P=0.2 take lowest values.

Figure 27:
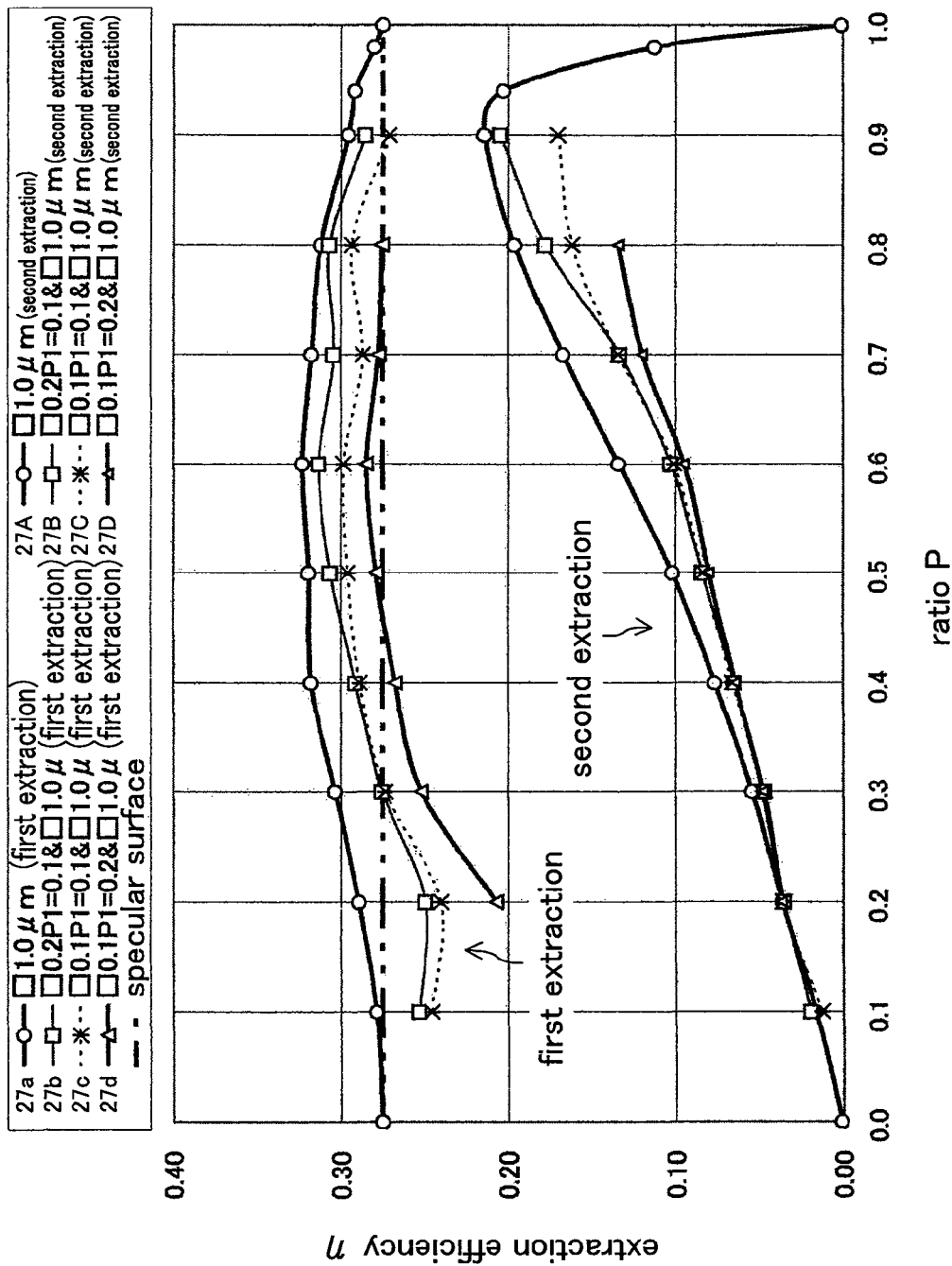
FIG. 27 is a diagram for describing the extraction efficiency of the second embodiment.

As can be seen from curve 27a of FIG. 27, the first-light extraction efficiency can be further increased by setting the proportion P which determines the area ratio of the concave portions and the convex portions to fall within the range of 0.4 to 0.8 around 0.6 as a center. This may be because the convex portion effectively functions as an optical waveguide when the proportion P falls within this range (when P≦0.2, the area proportion of the convex proportions forming waveguides is small, and when P≧0.8, the convex portions are excessively close to each other, so that the waveguide effect is reduced). On the other hand, according to curve 27A of FIG. 27, the second-light extraction efficiency can be further increased by setting the proportion P to fall within the range of 0.5 to 0.98 around 0.9 as a center. Therefore, for a total light extraction efficiency including the first- and second-light extraction efficiencies, it is preferable to set the proportion P to fall within the range of 0.4 to 0.98.

Thus, in this embodiment, a higher light extraction efficiency than that of the first embodiment is obtained by shifting the proportion P from 0.5. Moreover, as in the first embodiment, there is not a distribution of light intensity varying depending on the direction, and there is not an imbalance in color between directions, and moreover, the light extraction efficiency can be significantly improved, ambient light reflection can be suppressed, and the like, which are effects of the present invention.

Third Embodiment

A third embodiment will be described with reference to FIG. 6(b). Note that the third embodiment is different from the first and second embodiments only in the level difference conditions of the surface structure 13. The other components of the third embodiment are all the same as those of the first and second embodiments. The common components will not be described.

In the third embodiment, a difference in level between two adjacent minute regions $\delta_1$ and $\delta_2$ of the surface structure in the first and second embodiments takes a random value. In order to obtain the random level differences, in FIG. 2(a), the surface of the transparent substrate 5 is virtually divided into squares (minute square regions $\delta$) having a width w (referred to as a boundary width) of a grid pattern without a gap therebetween, and each square is set to a random height (or depth) having any value within the range of $-d_m/2$ to $d_m/2$ with reference to a single reference plane using a random function. The single reference plane may be a plane which is parallel with the surface of the transparent substrate 5 and is located at a middle between a highest minute region $\delta$ and a lowest minute region $\delta$ in a direction parallel with the surface normal of the surface of the transparent substrate 5. The value $d_m$ is a difference in location in a height direction between a highest minute region $\delta$ and a lowest minute region $\delta$.

FIG. 6(b) is a diagram for describing the light extraction efficiency of a surface structure in this embodiment, where the refractive index of the transparent substrate 5 is $n_1$=1.457, the refractive index of the air 6 is $n_0=1.0$, and the wavelength of light is $\lambda=0.635$ μm. The horizontal axis represents the boundary width (width of the minute region δ) w of the surface structure. First-light extraction efficiencies $\eta_1$ and second-light extraction efficiencies $\eta_2$ are shown for largest level differences $d_m=1.4$, 0.9, 0.7 and 0.3 μm. For the sake of convenience of calculation, the randomness of the value of the level difference from the reference plane is defined as follows: one of four level differences is randomly selected (the probability of occurrence of each value is 25%), i.e., for $d_m=1.4$ μm, the level difference randomly takes one of four values from −0.7 μm to 0.7 μm in 0.467-μm steps; for $d_m=0.9$ μm, the level difference randomly takes one of four values from −0.45 μm to 0.45 μm in 0.3-μm steps; for $d_m=0.7$ μm, the level difference randomly takes one of four values from −0.35 μm to 0.35 μm in 0.233-μm steps; and for $d_m=0.3$ μm, the level difference randomly takes one of four values from −0.15 μm to 0.15 μm in 0.1-μm steps. Note that the probability of occurrence of each value does not have to be uniform. For example, the probability of occurrence of a value corresponding to a lower (deeper) position may be smaller while the probability of occurrence of a value corresponding to a higher (shallower) position may be larger.

Curves 6i and 6I indicate first- and second-light extraction efficiencies, respectively, for $d_m=1.4$ μm. Curves 6h and 6H indicate first- and second-light extraction efficiencies, respectively, for $d_m=0.9$ μm. Curves 6g and 6G indicate first- and second-light extraction efficiencies, respectively, for $d_m=0.7$ μm. Curves 6f and 6F indicate first- and second-light extraction efficiencies, respectively, for $d_m=0.3$ μm. As is similar to the first example, all the first-light extraction efficiencies become maximum when the boundary width w is 0.2 to 2 μm. As w is decreased or increased from that point, each first-light extraction efficiency asymptotically approaches 0.27 (a value given by Expression 3, i.e., a light extraction efficiency when the surface is considered as a specular surface). The second-light extraction efficiency converges to zero as w is decreased when $w \leq 0.20$ μm, and asymptotically approaches 0.00 as w is increased from 8 μm, though not shown. Therefore, the range of the boundary width w needs to be 0.2 μm or more. Moreover, as discussed in the first example with reference to FIGS. 28 and 29, the boundary width w is preferably 1.5 μm or less, taking the viewing angle dependency into consideration. In FIG. 6(b), the first- and second-light extraction efficiencies ($\eta_1$ and $\eta_2$) calculated under conditions that $d_m=0.7$ μm and the boundary width w=0.6 μm are 0.331 and 0.141, respectively. Therefore, the characteristics obtained when $d_m=0.7$ μm show an improved second-light extraction efficiency as compared to the characteristics (curve 5A) obtained in the first embodiment and the characteristics (curves 6B and 6C) obtained in the second embodiment. This may be because the tips of the convex portions are not uniform, which increases the randomness of the pattern, and therefore, the randomness of propagation directions of light beams reflected by the surface structure is increased and the diffuseness of reflected light is increased, whereby light can enter, during second light extraction, in a state close to that of first light extraction (light intensities are uniform in all directions).

Note that, within the range of $w \geq 0.4$ μm, the characteristics during first light extraction are further deteriorated for $d_m=0.30$ μm than those for $d_m=0.70$ μm. Therefore, $d_m$ is preferably $d_m \geq 0.2$ to 0.3 μm (this range is the same as that of the first embodiment). Also, the characteristics during first light extraction for $d_m=1.40$ μm are slightly improved within the range of $w \geq 1.0$ μm as compared to those for $d_m=0.70$ μm. However, when $d_m$ is excessively large, it is difficult to fabricate the surface structure. In addition, the viewing angle characteristics are deteriorated under conditions that $w \geq 1.5$ μm (see FIGS. 28 and 29). Therefore, as a guide, the upper limit of $d_m$ is 1.40 μm. These ranges are the same as the range of $(\lambda/(n_1-n_0) \geq d_m \geq \lambda/6(n_1-n_0))$ of the first embodiment.

Thus, in the third embodiment, a higher light extraction efficiency than those of the first and second embodiments can be obtained by providing random level difference values. Moreover, as in the first embodiment, there is not a distribution of light intensity varying depending on the direction, and there is not an imbalance in color between directions, and moreover, ambient light reflection can be suppressed, and the like, which are effects of the present invention.

Note that it is considered that the level difference values are randomly selected under one of two sets of conditions: (1) the level difference value can take all values from 0 to the maximum level difference value $d_m$; and (2) the level difference value can take any of three or more values including 0 and the maximum level difference value $d_m$. As an example of (2), it is assumed that there are four level differences 0, $d_m/3$, $d_m \times 2/3$ and $d_m$. A shape transfer die for forming such a surface structure in a sheet surface can be fabricated by two exposure/etching steps (the first step: a mask pattern having a boundary width $w_1$ is used during exposure, and etching is performed to a depth of $d_m/3$, and the second step: a mask pattern having a boundary width $w_2$ is used during exposure, and etching is performed to a depth of $d_m \times 2/3$). In this case, the probability of occurrence of a discontinuous boundary line is maximized under conditions that $w_2=w_1$.

Moreover, it is assumed that there are seven heights (level differences) 0, $d_m/6$, $d_m \times 2/6$, $d_m \times 3/6$, $d_m \times 4/6$, $d_m \times 5/6$ and $d_m$. A shape transfer die for forming such a surface pattern structure in a sheet surface can be fabricated by three exposure/etching steps (the first step: a mask pattern having a boundary width $w_1$ is used during exposure, and etching is performed to a depth of $d_m/6$, the second step: a mask pattern having a boundary width $w_2$ is used during exposure, and etching is performed to a depth of $d_m \times 2/6$, and the third step: a mask pattern having a boundary width $w_3$ is used during exposure, and etching is performed to a depth of $d_m \times 3/6$). In this case, the probability of occurrence of a discontinuous boundary line is maximized under conditions that $w_1=w_2=w_3$.

Fourth Embodiment

A fourth embodiment will be described with reference to FIG. 7. Note that the fourth embodiment is different from the first embodiment only in the pattern of the surface structure. The other components of the fourth embodiment are all the same as those of the first embodiment. The common components will not be described.

Figure 7:
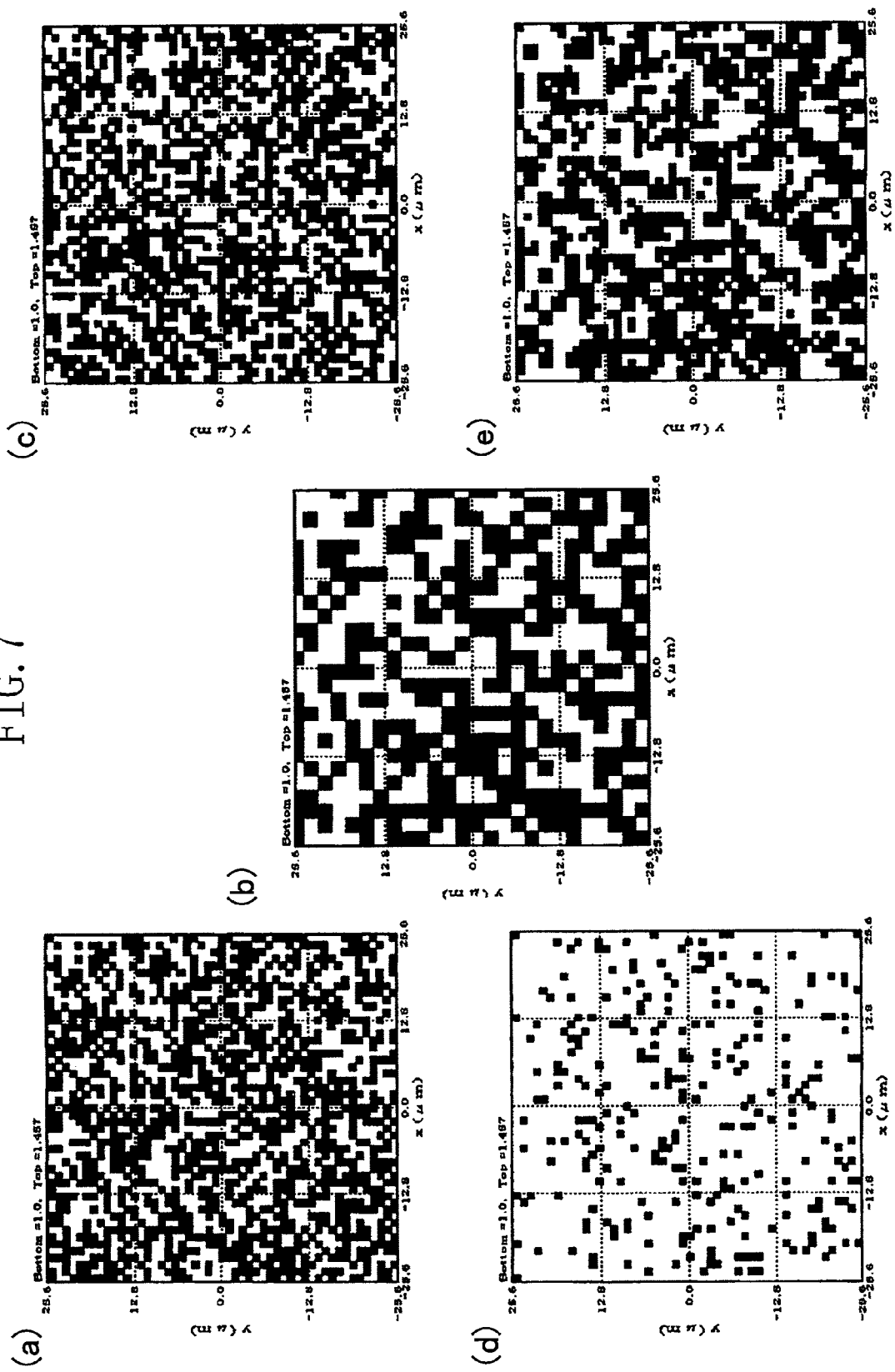
FIGS. 7(a) to 7(e) are diagrams for describing a process until a pattern of a surface structure is determined in a fourth embodiment.

FIG. 7 shows a process until a pattern of a surface structure of the fourth embodiment is determined. FIG. 7(a) shows an example in which the surface of the transparent substrate 5 is divided into squares (minute regions a) having a width $w_1$ of a grid pattern. The proportion of black squares and the proportion of white squares are each 50% and the black and white squares are randomly arranged. The width $w_1$ is 1 μm (although an optimal value of $w_1$ is much smaller, $w_1$ is assumed to be such a value for the sake of clarity of the figure). The black minute region α is referred to as a minute region $\alpha_1$, and the white minute region α is referred to as a minute region $\alpha_2$.

FIG. 7(b) shows an example in which the surface of the transparent substrate 5 is divided into squares (minute regions β) of a grid pattern, where each square has a width $w_2$ which is an integral multiple of $w_1$. The proportion of black squares is $P_2$ and the proportion of white squares is $1-P_2$, and $P_2=0.5$. The black and white squares are randomly arranged. The width $w_2$ is 2 μm. The black minute region β is referred to as a minute region $β_1$, and the white minute region β is referred to as a minute region $β_2$.

FIG. 7(c) shows a pattern which is generated by superimposing the patterns of FIGS. 7(a) and 7(b) in a manner that allows the grid squares thereof to match, and in accordance with a rule that a square where a black square ($α_1$) and a black square ($β_1$) exist becomes white, a square where a white square ($α_2$) and a white square ($β_2$) exist becomes white, a square where a white square ($α_2$) and a black square ($β_1$) exist becomes black, and a square where a black square ($α_1$) and a white square ($β_2$) exist becomes black. FIG. 7(c) finally provides a generation rule equivalent to that of the pattern of FIG. 7(a), and a pattern of the surface structure where the black squares correspond to convex portions and the white squares correspond to concave portions, which is the same as that of the first embodiment.

On the other hand, FIG. 7(d) shows an example in which the surface of the transparent substrate 5 is divided into squares (minute regions α) having a width $w_1$ of a grid pattern. The proportion of black squares is $P_1$ and the proportion of white squares is $1-P_1$, and the black and white squares are randomly arranged. The width $w_1$ is 1 μm, and the proportion $P_1$ of black squares is 0.1. As in FIG. 7(a), the black minute region α is referred to as a minute region $α_1$, and the white minute region α is referred to as a minute region $α_2$.

FIG. 7(e) shows a pattern which is generated by superimposing the patterns of FIGS. 7(d) and 7(b) in a manner that allows the grid squares thereof to match, and in accordance with a rule that a square where a black square ($α_1$) and a black square ($β_1$) exist becomes white, a square where a white square ($α_2$) and a white square ($β_2$) exist becomes white, a square where a white square ($α_2$) and a black square ($β_1$) exist becomes black, and a square where a black square ($α_1$) and a white square ($β_2$) exist becomes black. In FIG. 7(e), the area ratio of the black squares to the white squares is 1:1. The pattern of FIG. 7(e) has features similar to those of FIG. 7(c). For example, the black and white marks have the same minimum size. However, the pattern of FIG. 7(e) is different from that of FIG. 7(c) in that the occurrence proportion of the minimum size is low. The final ratio of the black and white squares (the area ratio of the concave and convex portions) is determined by the proportions $P_1$ and $P_2$. The proportion P of the black squares (the proportion of the convex portions) is given by $P=P_1+P_2-2P_1P_2$.

FIG. 27 additionally shows curves 27b and 27B indicating characteristics of first- and second-light extraction efficiencies ($η_1$ and $η_2$), where the projection height of the convex portion of the surface structure is d=0.70 μm, $w_1$=0.2 μm, $w_2$=1 μm, and $P_1$=0.1, and the horizontal axis represents the proportion P of the convex portions.

As can be seen from curve 27b of FIG. 27, the first-light extraction efficiency can be further increased by setting the proportion P which determines the area ratio of the concave portions to the convex portions to the range of 0.4 to 0.8 around 0.6 as a center, although the distribution of the concave and convex portions of the pattern is different from that of the first example. On the other hand, as can be seen from curve 27B, the second-light extraction efficiency can be further increased by setting the proportion P to the range of 0.5 to 0.9 (since $P_1$=0.1, curves 27b and 27B have no plots within the range of 0.1 or less and 0.9 or more). Therefore, as in the first example, the total light extraction efficiency including the first- and second-light extraction efficiencies can be increased by combining the proportions $P_1$ and $P_2$ to set the final proportion P of the convex portions to 0.5 to 0.98. Note that in FIG. 27, curves 27c and 27C show characteristics of first- and second-light extraction efficiencies, where $w_1$=0.1 μm and $P_1$=0.1, and curves 27d and 27D show characteristics of first- and second-light extraction efficiencies, where $w_1$=0.1 μm and $P_1$=0.2. If $w_1$ is less than 0.2 μm, the efficiency is significantly deteriorated. Therefore, $w_1$ needs to be 0.2 μm or more. Also, the upper limit of $w_1$ is preferably 1.5 μm or less, taking the viewing angle dependency into consideration, as discussed in the first embodiment with reference to FIGS. 28 and 29.

In the fourth embodiment, the conditions for formation of the surface structure of the first embodiment are slightly modified. The light extraction efficiency may be slightly lower than that of the first embodiment under some conditions, however, is still higher than that of the conventional light emitting device of FIGS. 14 and 15(a). As in the first embodiment, there is not a distribution of light intensity varying depending on the direction, and there is not an imbalance in color between directions, and moreover, the light extraction efficiency can be significantly improved, ambient light reflection can be suppressed, and the like, which are effects of the present invention. In addition, in the fourth embodiment, constraints on the shape of the surface structure are lower than those of the first embodiment, and therefore, a margin for error can be larger, whereby workability is advantageously increased. For example, when the conditions of the first embodiment are used, since a space between concave portions or a space between convex portions is small, it is difficult to fabricate a minute concave-and-convex pattern. In the fourth embodiment, the occurrence proportion of minute convex or concave portions is low (see FIGS. 7(c) and 7(e)), and therefore, a space between concave portions or a space between convex portions effectively becomes larger, whereby the difficulty in fabrication is reduced. Note that the fourth embodiment may be applied to the second embodiment, and in this case, an effect similar to that of the second embodiment can obviously be obtained.

Fifth Embodiment

A fifth embodiment is a combination of the fourth embodiment and the third embodiment. In this embodiment, colors are used to distinguish one region from another so as to make it easy to recognize settings of each region. In the fifth embodiment, initially, the surface of the transparent substrate 5 is divided into squares (minute regions α) having a width $w_1$ of a grid pattern. The proportion of black squares is $P_1$ and the proportion of white squares is $1-P_1$. The black and white squares are randomly arranged. The white regions (minute region $α_2$) are hollowed to a depth $d_1$ (>0) by etching or the like. Note that the black regions are referred to as minute regions $α_1$.

Next, the surface of the transparent substrate 5 is divided into squares (minute regions β) having a width $w_2$ of a grid pattern. The proportion of blue squares is $P_2$ and the proportion of red squares is $1-P_2$. The blue and red squares are randomly arranged. The red regions (minute region $δ_2$) are hollowed to a depth $d_2$ (>0) by etching or the like. Note that the blue regions are referred to as minute regions $δ_1$. Note that the width $w_2$ is an integral multiple of the width $w_1$ ($w_2=w_1$ is the most preferable). The squares of the grid patterns are superimposed in a manner that allows the boundary lines to match.

Thus, if a plane on which a white portion and a red portion exist is used as a reference plane, a stack of a black portion and a blue portion can have a height $d_1+d_2$, and a stack of a white portion and a blue portion can have the height $d_2$, or a stack of a black portion and a red portion can have the height $d_1$, with respect to the reference plane. Therefore, the level difference can randomly take one of four values within the range of 0 to $d_1+d_2$ (i.e., 0, $d_1$, $d_2$ and $d_1+d_2$), whereby the same effect as that of the third embodiment can be obtained.

In addition, if the depths $d_1$ and $d_2$ are set to $d_1=d_m\times1/3$ and $d_2=d_m\times2/3$, the depth of the pattern of the width $w_1$ which makes it difficult to fabricate a minute structure can be caused to be shallow, resulting in high workability. If $d_1=d_m\times1/3$ and $d_2=d_m\times2/3$, the proportion $P_2$ corresponds to the larger hollow depth (actually, the proportion $P_2$ has a weight of 2 and the proportion $P_1$ has a weight of 1 with respect to the average depth). Therefore, the proportion $P_2$ has a meaning similar to that of the area ratio of the concave and convex portions, i.e., the proportion $P_2$ of the fourth embodiment which determines an average level of the depths. On the other hand, the proportion $P_1$ relates to the occurrence proportion of the minute structures (width $w_1$), and therefore, has a meaning similar to that of the proportion $P_1$ of the fourth embodiment.

Although a combination of two kinds of exposure/etching steps is used in the aforementioned examples, a height can be randomly selected from eight values if three kinds of exposure/etching steps are used. In this case, the following step is added to the aforementioned two etching steps. Specifically, the surface of the transparent substrate 5 is divided into squares (minute regions γ) having a width $w_3$ of a grid pattern. The proportion of green squares is $P_3$ and the proportion of yellow squares is $1-P_3$. The green and yellow squares are randomly arranged. The yellow regions (minute regions $\gamma_2$) are hollowed to a depth $d_3$ (>0) by etching or the like. Note that the green regions are referred to as minute regions $\gamma_1$. Note that the width $w_3$ is an integral multiple of the width $w_2$ ($w_3=w_2$ is the most preferable). The squares are superimposed in a manner which allows the boundary lines to match.

In this case, when a plane on which a white portion, a red portion and a yellow portion exist is defined as a reference plane, a stack of a black portion, a blue portion and a green portion can have a height $d_1+d_2+d_3$, a stack of a white portion, a blue portion and a green portion can have a height $d_2+d_3$, a stack of a black portion, a blue portion and a yellow portion can have a height $d_1+d_2$, a stack of a black portion, a red portion and a green portion can have a height $d_1+d_3$, a stack of a black portion, a red portion and a yellow portion can have the height $d_1$, a stack of a white portion, a blue portion and a yellow portion can have the height $d_2$, and a stack of a white portion, a red portion and a green portion can have the height $d_3$, with respect to the reference plane. Therefore, the height can randomly take a value within the range of 0 to $d_1+d_2+d_3$, i.e., eight values (0, $d_1$, $d_2$, $d_3$, $d_1+d_2$, $d_2+d_3$, $d_3+d_1$, $d_1+d_2+d_3$). Therefore, the same effect as that of the third embodiment is obtained.

In addition, if the heights $d_1$, $d_2$ and $d_3$ are set to $d_1=d_m\times1/6$, $d_2=d_m\times2/6$ and $d_3=d_m\times3/6$, the depths of the patterns of the widths $w_1$ and $w_2$ which make it difficult to fabricate a minute structure can be caused to be shallow, resulting in high workability. If $d_1=d_m\times1/6$, $d_2=d_m\times2/6$ and $d_3=d_m\times3/6$, the proportions $P_2$ and $P_3$ correspond to the larger hollow depths (actually, the proportion $P_3$ has a weight of 3, the proportion $P_2$ has a weight of 2, and the proportion $P_1$ has a weight of 1, with respect to the average depth). Therefore, the proportions $P_2$ and $P_3$ have a meaning similar to that of the area ratio of the concave and convex portions, i.e., the proportion $P_2$ of the fourth embodiment which determines an average level of the depths. On the other hand, the proportion $P_1$ relates to the occurrence proportion of the minute structures (width $w_1$), and therefore, has a meaning similar to that of the proportion $P_1$ of the fourth embodiment.

Sixth Embodiment

A sixth embodiment will be described with reference to FIG. 1. Note that the sixth embodiment is different from the first embodiment only in the pattern of the surface structure 13. The other components of the sixth embodiment are all the same as those of the first embodiment. The common components will not be described.

In the sixth embodiment, two adjacent minute regions $\delta_1$ and $\delta_2$ in the surface structure of the first embodiment each include a phase shifter. The phase shifter may be, for example, formed of a multilayer film including layers having different refractive indices. Specifically, the phase of transmitted light can be adjusted by multiple reflection of the multilayer film. The structure (the thickness or the number of layers) of the multilayer film can be changed so that a region of 180 degrees and a region of 0 degrees can be randomly formed. Alternatively, polarizers may be used to change polarization of light transmitted through the two regions, which provides the same effect. In this case, the 180-degree polarizer causes transmitted light to be p-polarized light or right circular polarized light, and the 0-degree polarizer causes transmitted light to be s-polarized light or left circular polarized light. The polarizers can be implemented by half-wave plates having orientations different by 90 degrees. Note that a concave-and-convex interface structure having different refractive indices as described in the first example causes the phase of transmitted light to vary between concave and convex portions, and therefore, such a structure can be said to be a kind of phase shifter.

The incident angle dependency of the transmittance t and the light extraction efficiency of the surface structure 13 of this embodiment are already described with reference to FIGS. 21 and 5(b) (curves 5d and 5D). The first-light extraction efficiency alone can exceed a light extraction efficiency which is obtained when w is within the range of 0.4 μm or more and 1 μm or less and the surface is considered as a specular surface. FIG. 5(b) shows a result when the phase difference is 90 degrees. In FIG. 5(b), curves 5d' and 5D' indicate first- and second-light extraction efficiencies, respectively. Each of them is lower than that which is obtained when the phase difference is 180 degrees (curves 5d and 5D). Therefore, it can be seen that an optimal phase difference is 180 degrees.

Thus, according to the sixth embodiment, the surface structure 13 formed of a phase shifter can provide a higher light extraction efficiency than in the conventional art. Moreover, as in the first embodiment, there is not a distribution of light intensity varying depending on the direction and there is not an imbalance in color between directions, and moreover, ambient light reflection can be suppressed, and the like, which are effects of the present invention.

Seventh Embodiment

Figure 8:
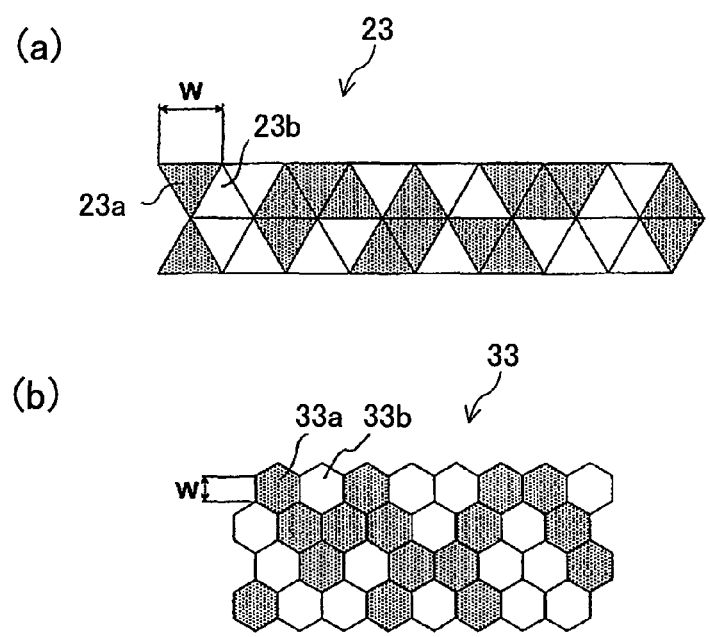
FIG. 8(a) is a diagram showing a first surface structure of a sixth embodiment.
FIG. 8(b) is a diagram showing a second surface structure of the sixth embodiment.

A seventh embodiment will be described with reference to FIG. 8. Note that the seventh embodiment is different from the first embodiment only in the pattern of the surface structure. The other components of the seventh embodiment are all the same as those of the first embodiment. The common components will not be described.

FIG. 8(a) is a diagram showing a pattern of a first surface structure 23 in this embodiment. As shown in FIG. 8(a), the surface structure 23 is obtained by dividing the surface of the transparent substrate 5 into equilateral triangles (minute regions δ) the lengths of the sides of which are w. The proportions of convex minute regions δ (in FIG. 8(a), reference symbol 23a (minute regions $\delta_1$), gray portions) and concave minute regions δ (in FIG. 8(a), reference symbol 23b (minute regions δ₂), white portions) are each 50%. The concave and convex portions are randomly arranged. The length w is 2.25 μm or less.

On the other hand, FIG. 8(b) is a diagram showing a pattern of a second surface structure 33 in this embodiment. The surface structure 33 is obtained by dividing the surface of the transparent substrate 5 into regular hexagons (minute regions δ) the lengths of the sides of which are w. The proportions of convex minute regions δ (in FIG. 8(b), reference symbol 33a (minute regions δ₁), gray portions) and concave minute regions δ (in FIG. 8(b), reference symbol 33b (minute regions δ₂), white portions) are each 50%. The concave and convex portions are randomly arranged. The length w is 0.93 μm or less.

More generally, the shape of each minute region needs to have a size which causes the diameter of a largest circle inscribed in the region to be 0.2 μm or more and 1.5 μm or less.

The seventh embodiment is different from the first embodiment only in the patterns of the surface structures 23 and 33. The seventh embodiment has the same operating principle and effect as those of the first embodiment. The shape of the minute regions is not limited to equilateral triangle and regular hexagon, and may be any polygon if the surface of the transparent substrate 5 can be divided into the same polygons without a gap therebetween.

Note that, in the first to seventh embodiments, the shape of a minute region in the surface structure 13, 23 or 33 in an actual workpiece is not an exact square, equilateral triangle or regular hexagon. A minute region may have a round corner, which may deform a corresponding corner of its adjacent minute region. Nevertheless, obviously, the characteristics are not deteriorated and the same effect is obtained. Moreover, when the seventh embodiment is applied to the second to sixth embodiments, effects similar to those of the second to sixth embodiments can be obtained.

Other Embodiments

The aforementioned embodiments are only for illustrating the present invention. The present invention is not limited to these examples. In the aforementioned embodiments, the cross-sectional shape of the convex portion of the surface structure perpendicular to the surface of the convex portion is not limited to a rectangle, and may be a trapezoid or a circular cone. The slanting surface of the convex portion may be curved.

Figure 9:
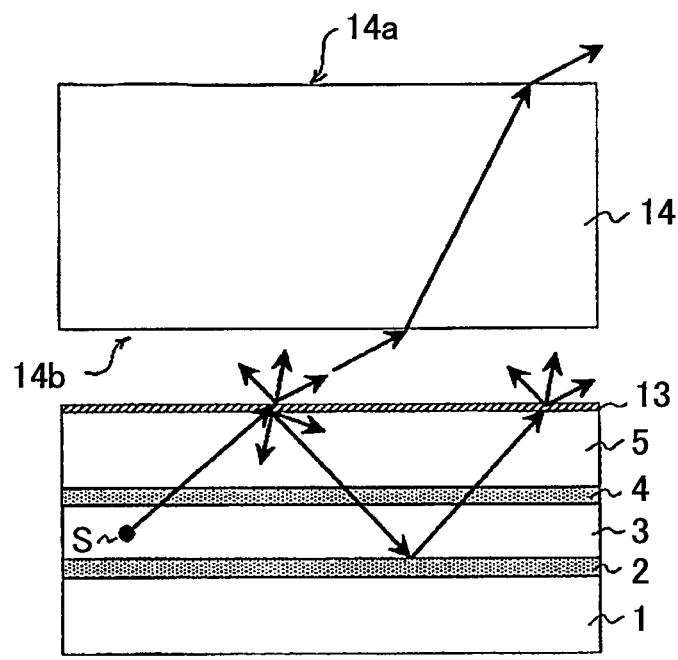
FIGS. 9(a) and 9(b) are diagrams for describing cross-sectional structures of light emitting devices employing an organic electroluminescence element in other embodiments and how light propagates through the light emitting devices.
Figure 9:
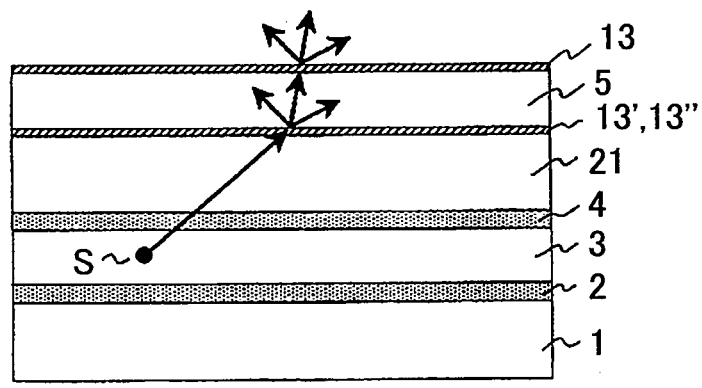

Moreover, when the transparent substrate 5 has a large thickness, a position through which light is emitted is located further away from the light production point S as the number of times of light extraction increases. In this case, if the surface structure is divided into pixels of about 300 μm as in a display EL, light strays from one pixel to another pixel adjacent thereto, leading to a deterioration in image quality. Therefore, as shown in FIG. 9(a), it is contemplated that the thickness of the transparent substrate 5 including the surface structure 13 is reduced to as thin as several micrometers, and the transparent substrate 5 is covered with a protective substrate 14 of about 0.2 mm to 0.5 mm with an air layer being interposed therebetween. A front surface 14a and a rear surface 14b of the protective substrate need an AR coating, although total reflection does not occur on these surfaces. In this case, instead of the air layer, a transparent material having a low refractive index, such as an aerogel or the like, may be provided on the surface structure 13. In this case, the transparent substrate 5 and the protective substrate 14 can be integrated, resulting in a highly stable device.

Moreover, although the surface structure 13 is formed on one surface in the embodiments above, similar structures can be formed on both surfaces of the transparent substrate 5. Moreover, a commonly used diffraction grating 13' may be provided between the surface structure 13 and the light production point S. In this case, as shown in FIG. 9(b), it is contemplated that the transparent substrate 5 is caused to be in the shape of a film, the surface structure 13 is formed on a front surface of the transparent substrate 5 and the diffraction grating 13' or another kind of surface structure 13" is formed on a rear surface of the transparent substrate 5, and the resultant transparent substrate 5 is adhered to the light emitting element with an adhesion layer 21 being interposed therebetween. When the refractive index of the transparent substrate 5 is small and a difference in refractive index between the transparent substrate 5 and the light emitting layer 3 is 0.1 or more, the adhesion layer 21 may be made of a material having a refractive index which is smaller by 0.1 or less than or is larger than that of the light emitting layer 3. In this case, substantially no total reflection occurs at an interface between the adhesion layer 21 and the light emitting layer 3. In addition, the surface structure 13" (or the diffraction grating 13') and the surface structure 13 can prevent total reflection which would otherwise occur at a surface of refraction between the adhesion layer 21 and the transparent substrate 5 and at a surface of refraction between the transparent substrate 5 and the air 6, respectively. Note that the depth of the concave portion or the height of the convex portion in the diffraction grating 13' or the surface structure 13" is preferably set so that transmitted light at the concave portion and transmitted light at the convex portion have a phase difference of π. Alternatively, the depth of the concave portion or the height of the convex portion may be smaller than that value.

Figure 10:
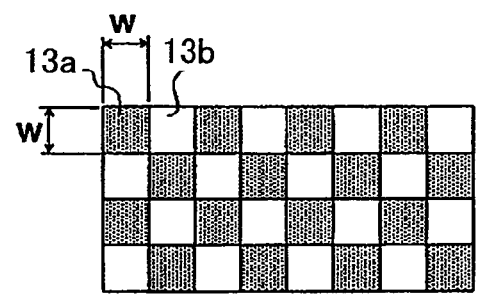
FIG. 10 is a pattern diagram showing a checkered surface structure.

For reference, FIG. 10 is a diagram showing a checkered pattern of a surface structure. In FIG. 10, the surface structure is obtained by dividing the surface of the transparent substrate 5 into squares the lengths of the sides of which are w. Gray squares 13a and white squares 13b are arranged in a checkered pattern. The gray portions have a convex shape and the white portions relatively have a concave shape.

Figure 11:
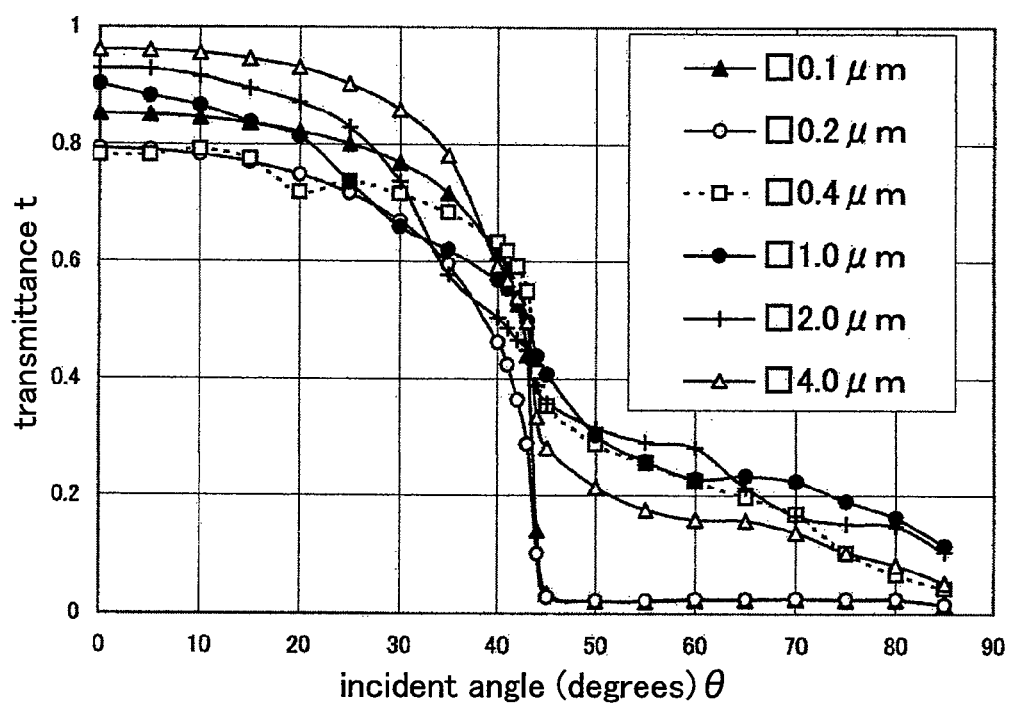
FIG. 11 is a diagram for describing the incident angle dependency of a transmittance t of the surface structure of FIG. 10.

FIG. 11 is a diagram for describing the incident angle dependency of the transmittance t of the surface structure of FIG. 10 under the same conditions as those of FIG. 5(a). The level difference between the concave and convex portions is d=0.70 μm. FIG. 11 shows what amount of light is emitted into the air 6 by first light extraction after light having a light amount of one enters the surface structure at an angle θ (angle from the normal to a surface of refraction) in the transparent substrate 5, where the width w is a parameter (w=0.1, 0.2, 0.4, 1.0, 2.0 and 4.0 μm). When FIG. 11 is compared to FIG. 3(a) which shows the characteristics of a random pattern, it can be seen that fine undulations are present in the curves, except for curves of w=0.1 and 0.2 μm (so-called nano-structures in which diffracted light does not occur). This is because diffracted light is generated or extinguished on the air layer side due to diffraction at the checkered pattern. Therefore, this indicates that there is a distribution of light intensity varying depending on the direction, which is a problem peculiar to periodic patterns.

For this checkered-pattern surface structure and the matrix-pattern surface structure of FIG. 17(b) (□w portions correspond to concave portions), first- and second-light extraction efficiencies are additionally shown in FIG. 5(b) (d=0.70 μm, curves 5e, 5f, 5E and 5F). A reason why the second-light extraction efficiency of the matrix pattern is large is the same as that for the phenomenon introduced in FIG. 27, i.e., the proportion of the convex portions of the matrix pattern is P=0.75. As compared to the characteristics of a random pattern, both the checkered pattern and the matrix pattern exhibit characteristics which undulate as w changes. This is also a problem peculiar to periodic patterns, which relates to a distribution of light intensity varying depending on the direction.

Figure 30:
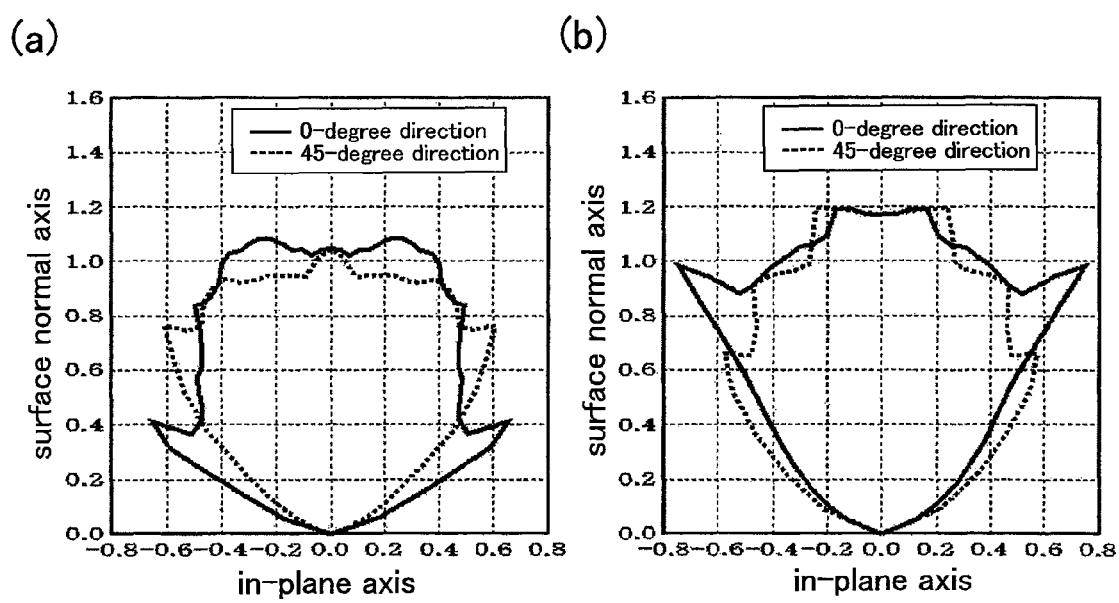
FIG. 30 is a diagram for describing the viewing angle dependency of light emitted from a checkered-pattern surface structure.

FIGS. 30(*a*) and 30(*b*) additionally show results of analysis of a viewing angle dependency of light obtained by first light extraction, where the light is emitted from the checkered-pattern surface structure. It is assumed that the level difference is d=0.7 µm and the boundary width is w=0.5 µm, and λ=0.450 µm (FIG. 30(*a*)) and λ=0.635 µm (FIG. 30(*b*)). It can be seen that solid lines (longitudinal directions of 0 and 90 degrees) and dashed lines (longitudinal directions of 45 and 135 degrees) significantly vary depending on the declination, and also significantly differ from each other, and their shapes significantly change depending on the wavelength. The occurrence of a distribution of light intensity varying depending on the direction or an imbalance in color is a fatal drawback for periodic patterns as in the light emitting device of Patent Document 1. These problems can be all overcome by the first to seventh embodiments.

The boundary diffraction effect occurs when portions where the phase of light is discontinuous are separated by a predetermined space. Therefore, in order to maximize the effect, it is necessary to maximize the occurrence proportion of discontinuous phase portions within a limited area. When it is assumed that a surface of refraction is divided into an infinite number of minute regions and a phase is discontinuous at a boundary between minute regions, the occurrence proportion is maximized under the following two sets of conditions. A first set of conditions is that the areas of the minute regions are as uniform as possible. A second set of conditions is that a phase difference is also present between adjacent minute regions. Specifically, if a minute region having a larger area than that of another minute region is present, then when this larger area is divided, the number of boundaries at which the phase is discontinuous increases by a larger amount. Conversely, if a minute region having a smaller area than that of another minute region is present, a minute region having a larger area than that of another minute region is present. In this case, if the larger area is divided, the number of boundaries at which the phase is discontinuous increases by a larger amount. As an extension of this, if the areas of the minute regions are as uniform as possible and at least the area of each minute region is 0.5 to 1.5 times as large as a reference area (the diameter of a largest circle inscribed in the minute region is 0.7 to 1.3 times as large as a reference diameter), the occurrence proportion of boundary lines between minute regions is maximized. These conditions are satisfied by the first to seventh embodiments. Even when the surface can be maximally divided into minute regions, then if phases between adjacent minute regions are uniform, the effect is weak. Therefore, adjacent minute regions also need to have a phase difference, i.e., random phases need to be assigned to minute regions. These conditions are satisfied by the fourth and fifth embodiments and the like. In other words, the light emitting devices of the embodiments above improve the extraction efficiency by the effect of maximizing the boundary diffraction effect, but not by the effect of preventing reflection which is achieved by the light emitting device of Patent Document 2.

Note that the surface shapes of the first to seventh embodiments are different from surface states, such as frosted glass, surface roughening and the like, and the surface state of the light emitting device of Patent Document 2. In the first, fourth and seventh embodiments, the surface is divided into squares (or polygons) having a width w of a grid pattern. The ratio of convex squares to concave squares is 1:1. This pattern has a specific scale (width w) and a specific shape of the minute region, and the ratio of the total area of the convex portions to the total area of the concave portions is 1:1. By contrast, in a surface state, such as frosted glass, surface roughening or the like, a specific width w is not present, the shape of the minute region is not fixed, and the ratio of the total area of the convex portions to the total area of the concave portions is not necessarily 1:1. In the second embodiment, the ratio of convex portions to concave portions is shifted from 50%, so that the ratio of the total area of the convex portions to the total area of the concave portions is deviated from 1:1. Nevertheless, a specific width w is still present, and the ratio of the total area of the convex portions to the total area of the concave portions has a predetermined value which is much closer to 1.1 than that of perfectly random patterns. Also in the third and fifth embodiments, a specific width w is present, and there is a level difference between each square (or polygon) of a grid pattern defined by the width w. Thus, the surface pattern of the embodiments above can be said to be a random pattern having regularity to some extent, but not a perfectly random pattern.

Figure 12:
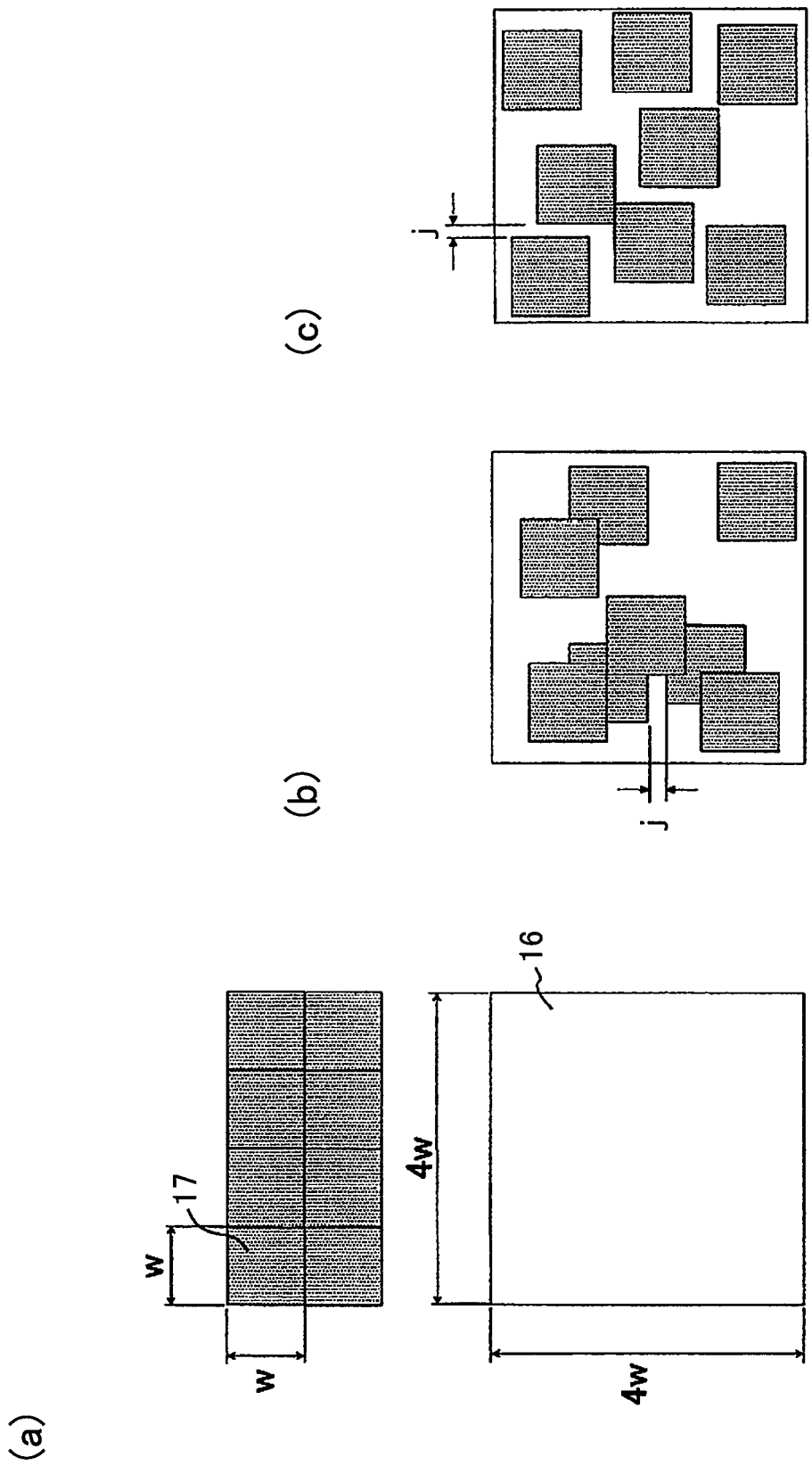
FIGS. 12(a) to 12(c) are diagrams for describing how projections are randomly arranged.

A difference from a perfectly random pattern will be a little more discussed. As shown in FIG. 12(*a*), eight cards 17 having a width w are randomly arranged on a table 16 having a width 4w. The total area of the eight cards 17 is ½ of the total area of the table 16. Note that it is assumed that the cards 17 do not lie off the table 16. FIG. 12(*b*) shows an arrangement in which the cards 17 are permitted to overlap. FIG. 12(*c*) shows an arrangement in which the cards 17 are not permitted to overlap. In FIG. 12(*b*), the total area of the cards 17 is smaller than ½ of the area of the table by the area of overlapping portions of the cards 17. As already shown by curves 27*a* and 27A of FIG. 27, if the area ratio is deviated from a predetermined ratio, the light extraction efficiency is deteriorated. In FIG. 12(*c*), whereas the area ratio is maintained at ½, a gap j smaller than w occurs between cards, which also occurs in FIG. 12(*b*). If the minute gap j occurs and its frequency increases, the gap j can be considered as a new boundary width. In this case, as can be seen from FIG. 6, the light extraction efficiency significantly deteriorates under conditions that j≦0.1 µm. Moreover, as shown in FIG. 27, since the proportion $P_1$ of a minute concave-and-convex structure is increased (curves 27*a*, 27*c* and 27*d* correspond to increasing proportions $P_1$=0.0, 0.1 and 0.2, respectively, where $w_1$=0.1 µm), both the first- and second-light extraction efficiencies deteriorate regardless of the same total proportion of the convex portions. Thus, a perfectly random pattern alone cannot maximize the light extraction efficiency.

The principle of random pattern generation employed in the embodiments above is not different from that of FIG. 12. In the embodiments above, the area ratio is maintained at a predetermined value, and therefore, a scale smaller than the width w, such as the minute gap j or the like, does not occur. Thus, the surface shapes of the embodiments above can be said to be a random pattern having regularity for maximizing the light extraction efficiency, but not a perfectly random pattern.

Moreover, the phenomenon caused by the surface shapes of the first to seventh embodiments is a kind of diffraction phenomenon. As shown in FIG. 18, in the diffraction phenomenon, when a light beam which is virtually refracted with respect to a flat reference plane averaging the surface shape is referred to as a zero-order diffracted light (does not appear in the case of total reflection), higher-order diffracted light beams occur in directions deviated from the zero-order diffracted light. By the random surface shape of the present invention, diffracted light beams other than zero-order diffracted light propagate in random directions. By contrast, frosted glass or surface roughening causes a kind of refraction phenomenon, but not a diffraction phenomenon. In an uneven surface of refraction, the surface normals have random directions, and therefore, directions of refraction only become random. Specifically, when the surface shape of the first to seventh embodiments is formed on a parallel plate, a contour of an object on the opposite side is clearly seen through the plate. This is because a zero-order diffracted light beam is inevitably present in light beams diffracted and separated by the surface shape, and the contour of the object on the opposite side is maintained by the light. By contrast, in the case of frosted glass or surface roughening, light corresponding to zero-order diffracted light is not present, and therefore, the contour of an object on the opposite side is blurred when seen through it. Patent Document 2 only describes that light is "obediently emitted into air" by projections in the surface, but does not mention the term "diffraction." The term "obediently" can be interpreted as "being obedient to Snell's law (law of refraction)." In this sense, it could be understood that the technique of Patent Document 2 falls into the same category to which frosted glass and surface roughening belong. Patent Document 2 can be said to be different from the present invention.

In this regard, a feature of the technique of Patent Document 2 is that a plurality of transparent projections are perfectly randomly arranged on a transparent insulator substrate. Patent Document 2 does not describe or suggest the feature of the present invention that concave and convex portions are provided as at least one group of minute regions having the same shape, and the existence ratio of the convex portions to the concave portions is set to a specific value. For example, in the first embodiment, a structure in which the concave portions and the convex portions are exchanged or a structure in which the height and depth of each minute region are exchanged is substantially the same as the original structure. This is not the case for the light emitting device of Patent Document 2. The present inventors are the first to find that the feature of such an illustrative embodiment exhibits a significant light extraction effect. Such a significant effect of the embodiment is not described in Patent Document 2. In the light emitting device of Patent Document 2, projections having a width of 0.4 µm or more and 20µ or less are perfectly randomly arranged at a density of 5000 to $10^6$ per unit area (/mm$^2$). A portion of the light emitting device of the embodiment above is encompassed by the light emitting device of Patent Document 2 in terms of the form. However, the relationship between the projections and the other portions and the relationship in the existence proportions therebetween, and the effect which can be exhibited only after such relationships are provided, are not described or suggested by Patent Document 2. Therefore, the embodiments above are not substantially encompassed by the technique of Patent Document 2, and the present invention is totally different from the subject matter of Patent Document 2.

Note that the phase of light is shifted by convex and convex shapes in the first to sixth embodiments. The phase of light can be shifted by shapes other than convex and convex shapes. For example, the phase shift can also be achieved by changing thicknesses or refractive indices of regions of a multilayer film corresponding to convex and convex portions. Also in this case, the same effect as that of the embodiments above can be obviously obtained. Moreover, the first to seventh embodiments may not be independently satisfied and portions thereof may be combined into a new example. Although an organic electroluminescence element has been described as an example in the first to seventh embodiments, the present invention is applicable to any element that can emit light in a medium having a refractive index of one or more. For example, the present invention is applicable to an LED, a light guide plate and the like. Moreover, a medium into which the light emitting device emits light is not limited to air. The surface structures of the embodiments above are applicable to a case where the refractive index of the transparent substrate is larger than that of a medium which the transparent substrate contacts, particularly by 0.1 or more.

INDUSTRIAL APPLICABILITY

As described above, the light emitting device of the present invention is useful as a display, a light source or the like since the light emitting device significantly improves light extraction efficiency, and in addition, has satisfactory viewing angle characteristics of emitted light.

The invention claimed is:

1. A transparent sheet having a first surface and a second surface, wherein
    the first surface is adjacent to a light emitting element in use,
    the second surface includes a plurality of minute regions δ comprising a plurality of minute regions $δ_1$ and a plurality of minute regions $δ_2$,
    the plurality of minute regions $δ_1$ being randomly arranged and accounting for 40% or more and 98% or less of the plurality of minute regions δ, and the plurality of minute regions $δ_2$ being the other minute regions δ,
    among the plurality of minute regions δ, a diameter of a largest circle inscribed in the minute region δ being 0.2 µm or more and 8.0 µm or less, and one minute region δ being adjacent to and surrounded by a plurality of other minute regions δ,
    each minute region $δ_1$ projects to a position above the minute region $δ_2$,
    each minute region $δ_2$ dents to a position below the minute region $δ_1$, each minute region $δ_1$ having a height d above a bottom of each minute region $δ_2$,
    and
    d is 0.2 µm or more and 1.4 µm or less.

2. A transparent sheet having a first surface and a second surface, wherein
    the first surface is adjacent to and in contact with a light emitting element in use,
    the second surface includes a plurality of minute regions δ, a diameter of a largest circle inscribed in the minute region δ being 0.2 µm or more and 8.0 µm or less, and one minute region δ being adjacent to and surrounded by a plurality of other minute regions δ,
    each of the plurality of minute regions δ is located at a random height in a direction perpendicular to the second surface, the plurality of minute regions δ including a minute region δ located at a highest position and a minute region δ located at a lowest position in the direction perpendicular to the second surface, the minute region δ located at the highest position having a height d above a bottom of the minute region δ located at the lowest position, the bottom of which is at the second surface, and
    d is 0.2 µm or more and 1.4 µm or less.

3. A transparent sheet having a first surface and a second surface, wherein
    the first surface is adjacent to and in contact with a light emitting element in use,
    the second surface includes a plurality of minute regions δ, a diameter of a largest circle inscribed in the minute region δ being 0.4 μm or more and 4.0 μm or less, and one minute region δ being adjacent to and surrounded by a plurality of other minute regions δ, the plurality of minute regions δ include a plurality of minute regions $δ_1$ and a plurality of minute regions $δ_2$, and the minute region $δ_1$ and the minute region $δ_2$ cause light transmitted through the minute region $δ_1$ and light transmitted through the minute region $δ_2$ after entering the first surface in a direction perpendicular to the one surface, to generate a phase difference of 180 degrees.

4. The sheet of any one of claims 1 to 3, wherein the minute regions δ have congruent polygonal shapes.

5. A light emitting device comprising a light emitting element, and a transparent protective layer provided on a light emission surface of the light emitting element, wherein a second surface opposite to a first surface adjacent to the light emission surface of the protective layer includes a plurality of minute regions δ comprising a plurality of minute regions $δ_1$ and a plurality of minute regions $δ_2$, the plurality of minute regions $δ_1$ being randomly arranged and accounting for 40% or more and 98% or less of the plurality of minute regions δ, and the plurality of minute regions $δ_2$ being the other minute regions δ, among the plurality of minute regions δ, a diameter of a largest circle inscribed in the minute region δ being 0.2 μm or more and 8.0 μm or less, and one minute region δ being adjacent to and surrounded by a plurality of other minute regions δ, each minute region $δ_1$ projects to a position above the minute region $δ_2$, each minute region $δ_2$ dents to a position below the minute region $δ_1$, each minute region $δ_1$ having a height d above a bottom of each minute region $δ_2$, the light emitting element emits light having a center wavelength λ of an emission spectrum, and $λ/6(n_1-n_0) < d < λ/(n_1-n_0)$, where $n_1$ represents a refractive index of the protective layer, $n_0$ represents a refractive index of a medium contacting the second surface of the protective layer, and $n_0 < n_1$.

6. A light emitting device comprising a light emitting element, and a transparent protective layer provided on a light emission surface of the light emitting element, wherein a second surface opposite to a first surface adjacent to the light emission surface of the protective layer includes a plurality of minute regions δ, a diameter of a largest circle inscribed in the minute region δ being 0.2 μm or more and 8.0 μm or less, and one minute region δ being adjacent to and surrounded by a plurality of other minute regions δ, each of the plurality of minute regions δ is located at a random height in a direction perpendicular to the second surface, the plurality of minute regions δ including a minute region δ located at a highest position and a minute region δ located at a lowest position in the direction perpendicular to the second surface, the minute region δ located at the highest position having a height d above a bottom of the minute region δ located at the lowest position, the bottom of which is at the second surface, the light emitting element emits light having a center wavelength λ of an emission spectrum, and $λ/6(n_1-n_0) < d < λ/(n_1-n_0)$, where $n_1$ represents a refractive index of the protective layer, $n_0$ represents a refractive index of a medium contacting the second surface of the protective layer, and $n_0 < n_1$.

7. A light emitting device comprising a light emitting element, and a transparent protective layer provided on a light emission surface of the light emitting element, wherein a second surface opposite to a first surface adjacent to and in contact with the light emission surface of the protective layer includes a plurality of minute regions δ, a diameter of a largest circle inscribed in the minute region δ being 0.4 μm or more and 4.0 μm or less, and one minute region δ being adjacent to and surrounded by a plurality of other minute regions δ, the plurality of minute regions δ include a plurality of minute regions $δ_1$ and a plurality of minute regions $δ_2$, and the minute region $δ_1$ and the minute region $δ_2$ cause light transmitted through the minute region $δ_1$ and light transmitted through the minute region $δ_2$ after entering the first surface adjacent to the light emission surface of the protective layer in a direction perpendicular thereto, to generate a phase difference of 180 degrees.

8. The light emitting device of claim 5 or 6, wherein the medium is air.

9. The light emitting device of claim 5 or 6, wherein the medium is an aerogel.

10. The light emitting device of claim 5 wherein $n_2-n_1 < 0.1$, where $n_2$ represents a refractive index of a portion of the light emitting element in which light is produced.

11. The light emitting device of claim 6, wherein $n_2-n_1 < 0.1$, where $n_2$ represents a refractive index of a portion of the light emitting element in which light is produced.

12. The light emitting device of claim 8, wherein $n_2-n_1 < 0.1$, where $n_2$ represents a refractive index of a portion of the light emitting element in which light is produced.

13. The light emitting device of claim 9, wherein $n_2-n_1 < 0.1$, where $n_2$ represents a refractive index of a portion of the light emitting element in which light is produced.

14. The light emitting device of claim 1, wherein the diameter of a largest circle inscribed in the minute region δ being 0.2 μm or more and 1.5 μm or less.

15. The light emitting device of claim 2, wherein the diameter of a largest circle inscribed in the minute region δ being 0.2 μm or more and 1.5 μm or less.

16. The light emitting device of claim 3, wherein the diameter of a largest circle inscribed in the minute region δ being 0.4 μm or more and 1.0 μm or less.

17. The light emitting device of claim 5, wherein the diameter of a largest circle inscribed in the minute region δ being 0.2 μm or more and 1.5 μm or less.

18. The light emitting device of claim 6, wherein the diameter of a largest circle inscribed in the minute region δ being 0.2 μm or more and 1.5 μm or less.

19. The light emitting device of claim 7, wherein the diameter of a largest circle inscribed in the minute region δ being 0.4 μm or more and 1.0 μm or less.

20. The transparent sheet of claim 1, wherein at least one of the minute regions δ has a cross-sectional shape perpendicular to the second surface that is a trapezoid.

21. The transparent sheet of claim 2, wherein at least one of the minute regions δ has a cross-sectional shape perpendicular to the second surface that is a trapezoid.

22. The transparent sheet of claim 3, wherein at least one of the minute regions δ has a cross-sectional shape perpendicular to the second surface that is a trapezoid.

23. The transparent sheet of claim 1, wherein at least one of the minute regions δ has a curved slanting surface.

24. The transparent sheet of claim 2, wherein at least one of the minute regions δ has a curved slanting surface.

25. The transparent sheet of claim 3, wherein at least one of the minute regions δ has a curved slanting surface.

26. The light emitting device of claim 5, wherein at least one of the minute regions δ has a cross-sectional shape perpendicular to the second surface that is a trapezoid.

27. The light emitting device of claim 6, wherein at least one of the minute regions δ has a cross-sectional shape perpendicular to the second surface that is a trapezoid.

28. The light emitting device of claim 7, wherein at least one of the minute regions δ has a cross-sectional shape perpendicular to the second surface that is a trapezoid.

29. The transparent sheet of claim 5, wherein at least one of the minute regions δ has a curved slanting surface.

30. The transparent sheet of claim 6, wherein at least one of the minute regions δ has a curved slanting surface.

31. The transparent sheet of claim 7, wherein at least one of the minute regions δ has a curved slanting surface.

32. The transparent sheet of claim 2, wherein the light emitting element is an organic electroluminescence element (EL).

33. The transparent sheet of claim 3, wherein the light emitting element is an organic electroluminescence element (EL).

34. The light emitting device of claim 6, wherein the light emitting element is an organic EL element.

35. The light emitting device of claim 7, wherein the light emitting element is an organic EL element.

36. The light emitting device of claim 5-7, the medium contacting the second surface of the protective layer is a transparent material.

37. A light emitting device comprising a first electrode, a light emitting layer, a second electrode, an adhesion layer, and a transparent material, in this order, wherein
the adhesion layer and the transparent material are adjacent to each other,
a second surface of the adhesion layer opposite to a first surface of the adhesion layer adjacent to the transparent material includes a plurality of minute regions δ comprising a plurality of minute regions $\delta_1$ and a plurality of minute regions $\delta_2$,
the plurality of minute regions $\delta_1$ being randomly arranged and accounting for 40% or more and 98% or less of the plurality of minute regions δ, and the plurality of minute regions $\delta_2$ being the other minute regions δ,
among the plurality of minute regions δ, a diameter of a largest circle inscribed in the minute region δ being 0.2 μm or more and 8.0 μm or less, and one minute region δ being adjacent to and surrounded by a plurality of other minute regions δ,
each minute region $\delta_1$ projects to a position above the minute region $\delta_2$,
each minute region $\delta_2$ dents to a position below the minute region $\delta_1$, each minute region $\delta_1$ having a height d above a bottom of each minute region $\delta_2$,
the light emitting element emits light having a center wavelength λ of an emission spectrum, and
$\lambda/6(n_1-n_0)<d<\lambda/(n_1-n_0)$, where $n_1$ represents a refractive index of the adhesion layer, $n_0$ represents a refractive index of the transparent material, and $n_0<n_1$.

38. The transparent sheet of claim 3, wherein the plurality of minute regions δ have a same shape.

* * * * *